US010795102B2

(12) United States Patent
Hsiao et al.

(10) Patent No.: US 10,795,102 B2
(45) Date of Patent: Oct. 6, 2020

(54) INTERCONNECTION SYSTEM WITH HYBRID TRANSMISSION

(71) Applicants:FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventors: Shih-Wei Hsiao, New Taipei (TW); Hsiu-Yuan Hsu, New Taipei (TW); Wei-Chih Lin, New Taipei (TW); Shuo-Hsiu Hsu, New Taipei (TW); Yen-Hsu Ko, New Taipei (TW); Chih-Chung Hsieh, New Taipei (TW); Cheng-Kai Huang, New Taipei (TW); Paul Chen, Walnut, CA (US); Genn-Sheng Lee, New Taipei (TW); Jia-Hau Liu, New Taipei (TW); Mao-Chun Weng, New Taipei (TW); Wayne Chou, Brea, CA (US)

(73) Assignees: FUDING PRECISION COMPONENTS (SHENZHEN) CO., LTD, Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/238,534

(22) Filed: Jan. 3, 2019

(65) Prior Publication Data

US 2019/0235188 A1 Aug. 1, 2019

Related U.S. Application Data

(60) Provisional application No. 62/613,064, filed on Jan. 3, 2018.

(51) Int. Cl.
*H05K 1/11* (2006.01)
*H05K 1/14* (2006.01)
(Continued)

(52) U.S. Cl.
CPC .......... *G02B 6/4279* (2013.01); *G02B 6/428* (2013.01); *G02B 6/4284* (2013.01);
(Continued)

(58) Field of Classification Search
CPC .... G02B 6/3885; G02B 6/421; G02B 6/4279; G02B 6/428; G02B 6/4284; G02B 6/4292;
(Continued)

(56) References Cited

U.S. PATENT DOCUMENTS 8,909,135 B2 12/2014 McCormack et al.
10,171,180 B2 * 1/2019 Sipes, Jr. ............. H04B 10/808
(Continued)

*Primary Examiner* — Yuriy Semenenko
(74) *Attorney, Agent, or Firm* — Wei Te Chung; Ming Chieh Chang

(57) ABSTRACT

A interconnection system includes a panel side kit and a wall-mount kit coupled with each other and secured together via magnetic forces. The wall-mount kit includes a printed circuit board enclosed within a bracket and defining a center region for power transmission and a pair of side regions for high speed transmission. In the side regions, on the coupling side a plurality of wireless transmission units are located while on the back side a plurality of ROSA OE modules are provided to transfer the optical signal from optical fibers to the electronic signal for wireless transmission wherein the optical fibers are linked to a control box via a plurality of TOSA EO modules. The panel side kit includes wireless receiving units that interact with the wireless transmission units, and a plurality of connectors with the body of the display.

19 Claims, 37 Drawing Sheets

(51) Int. Cl.
*G02B 6/42* (2006.01)
*H05K 1/02* (2006.01)
*H05K 5/03* (2006.01)
*H05K 5/00* (2006.01)
*H05K 5/02* (2006.01)
*H01R 12/70* (2011.01)
*H01R 12/71* (2011.01)
*H05K 1/18* (2006.01)
*G02B 6/38* (2006.01)

(52) U.S. Cl.
CPC ....... *G02B 6/4292* (2013.01); *H01R 12/7088* (2013.01); *H01R 12/716* (2013.01); *H05K 1/0243* (2013.01); *H05K 1/141* (2013.01); *H05K 1/144* (2013.01); *H05K 1/181* (2013.01); *H05K 5/0008* (2013.01); *H05K 5/0017* (2013.01); *H05K 5/0204* (2013.01); *H05K 5/03* (2013.01); *G02B 6/3885* (2013.01); *G02B 6/421* (2013.01); *H05K 2201/042* (2013.01); *H05K 2201/048* (2013.01); *H05K 2201/09018* (2013.01); *H05K 2201/09063* (2013.01); *H05K 2201/10121* (2013.01); *H05K 2201/10189* (2013.01); *H05K 2201/10356* (2013.01); *H05K 2201/10522* (2013.01)

(58) Field of Classification Search
CPC .............. H01R 12/7088; H01R 12/716; H05K 1/0243; H05K 1/141; H05K 1/144; H05K 1/181; H05K 2201/042; H05K 2201/048; H05K 2201/09018; H05K 2201/09063; H05K 2201/10121; H05K 2201/10189; H05K 2201/10356; H05K 2201/10522; H05K 5/0008; H05K 5/0017; H05K 5/0204; H05K 5/03
See application file for complete search history.

(56) References Cited

U.S. PATENT DOCUMENTS

| | | | |
|---|---|---|---|
| 2002/0146207 A1* | 10/2002 | Chu | G02B 6/4277 385/53 |
| 2006/0038168 A1* | 2/2006 | Estes | B82Y 10/00 257/25 |
| 2011/0031320 A1* | 2/2011 | Kato | G06K 19/07749 235/492 |
| 2015/0277849 A1* | 10/2015 | Beaumier | G06F 3/162 715/716 |
| 2015/0319846 A1* | 11/2015 | Kubo | H05K 1/0216 361/767 |
| 2016/0020858 A1* | 1/2016 | Sipes, Jr. | H04B 10/808 398/45 |
| 2018/0168060 A1* | 6/2018 | Ryu | G02F 1/133308 |
| 2018/0219635 A1* | 8/2018 | Sipes, Jr. | H04N 21/4436 |

* cited by examiner

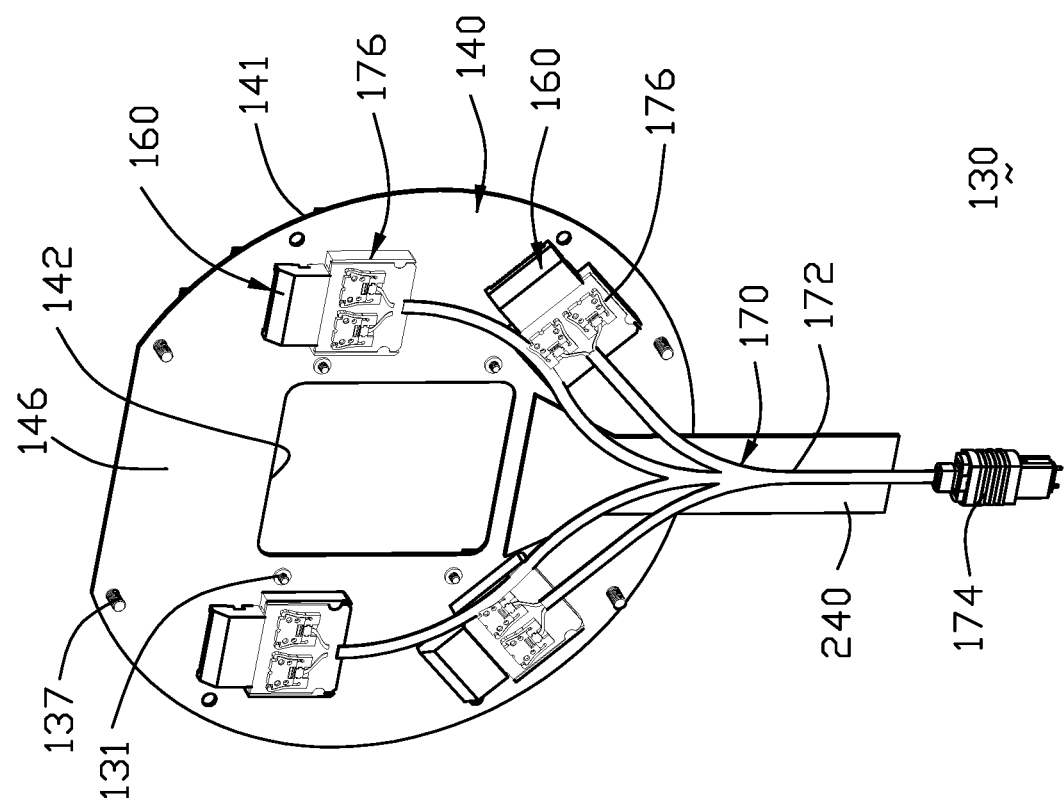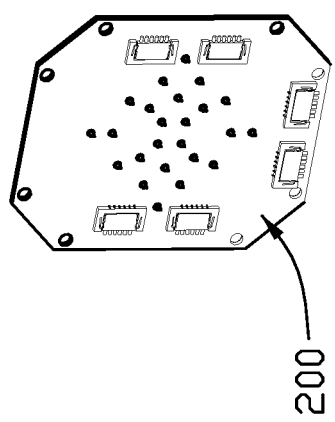
FIG. 8

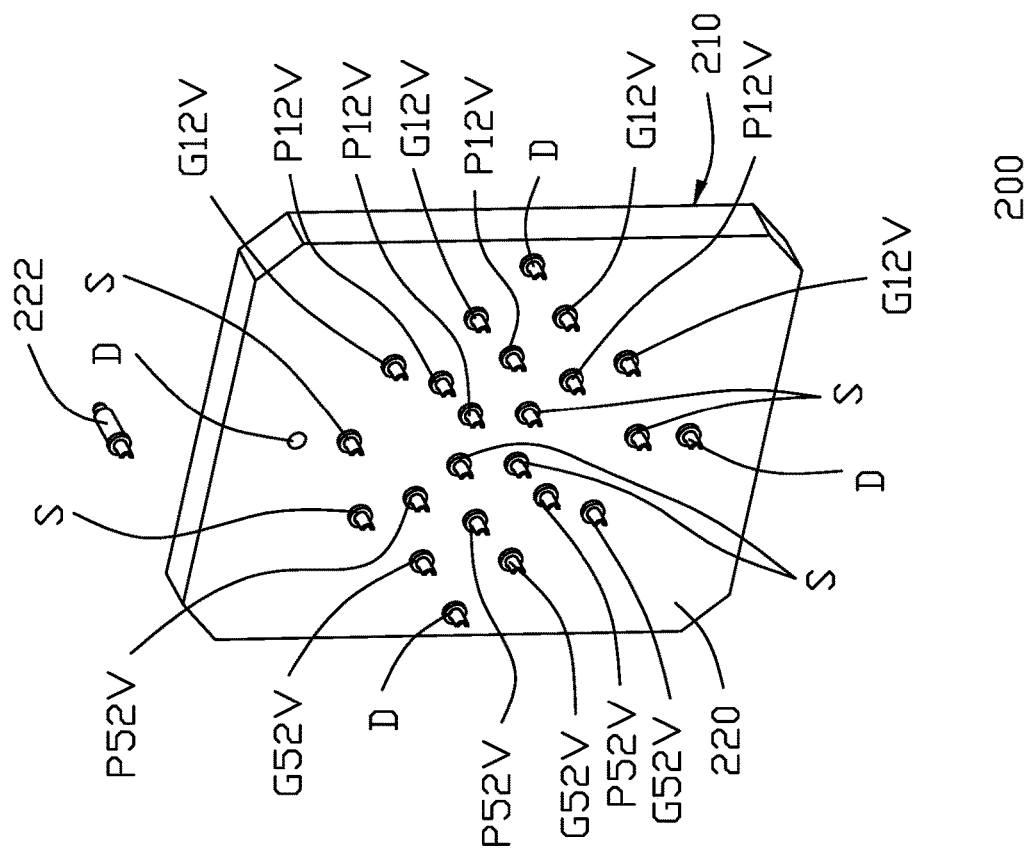
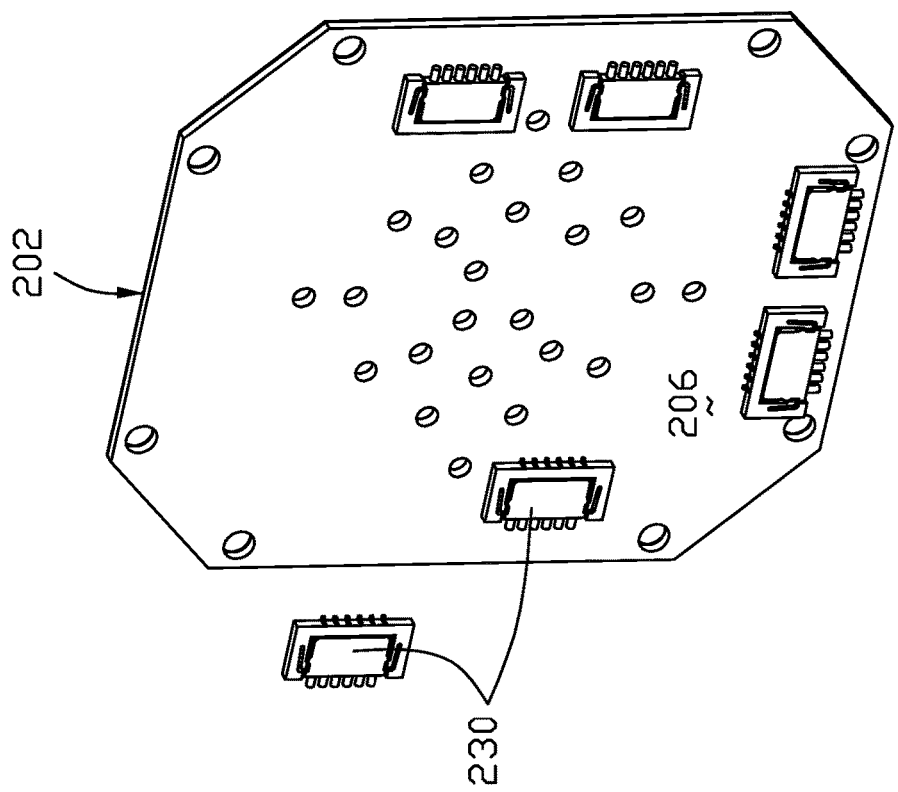
FIG. 12

- One OE module includes 2x lens array.
- One lens array includes:
  - 1x quad-lane OE chip (ex: VCSEL or PD)
  - 1x quad-lane drivers (ex: LDD or TIA)
  - 1x micro lens array
  - 1x jumper with 4x multi-mode fibers

INTERCONNECTION SYSTEM WITH HYBRID TRANSMISSION

FIELD OF THE DISCLOSURE

The invention is related to an electrical connection system for use with a detachable display and a wall mount seat, and particularly to the hybrid type transmission therebetween including the extremely high frequency/high speed signal transmission, the low speed signal transmission and the power transmission. It is noted that all disclosures in the instant application may cover the contents derived from others belonging to another entity whose names are not provided in this application.

SUMMARY OF THE DISCLOSURE

An interconnection system for use with a detachable display and a wall mount seat, includes a panel side kit and a wall-mount kit coupled with each other. In an embodiment, the panel side kit and a wall-mount kit are secured together via magnetic forces, as disclosed in a provisional application titled "Rear Structure for Display Panel," filed on the same day with this application. The wall-mount side kit includes a printed circuit board enclosed within a bracket and defining a center region for power transmission and a pair of side regions for high speed transmission. In the side regions, on the coupling side a plurality of wireless transmission units are located while on the back side a plurality of ROSA OE modules are provided to transfer the optical signal from optical fibers to the electronic signal for such wireless transmission wherein the optical fibers are linked to a control box via a plurality of TOSA EO/OE modules. In an embodiment, the ROSA OE modules are arranged with differently oriented pairs for superior space management. The panel side kit includes another printed circuit board enclosed within a cover and defining a center area for power transmission and a pair of side areas for high speed transmission. In the side area, on the coupling side, a plurality of wireless receiving units are located for interacting with the wireless transmission units while on the back side a plurality of connectors with the associated cables are mounted wherein the cables extend through the boundary of the cover radially for connection with the body of the display. In an embodiment, the connectors are arranged with differently oriented pairs for superior space management. The wireless transmission made in the invention refers to the technology disclosed in U.S. Pat. No. 8,909,135 issued to Keyssa.

BRIEF DESCRIPTION OF THE DRAWINGS

FIG. 8 is an opposite perspective view of the core set of the wall-mount kit of FIG. 7;

FIG. 12 is an opposite exploded perspective view of the power board module of the core set of the wall-mount kit of FIG. 11;

DETAILED DESCRIPTION OF THE PREFERRED EMBODIMENT

Figure 1:
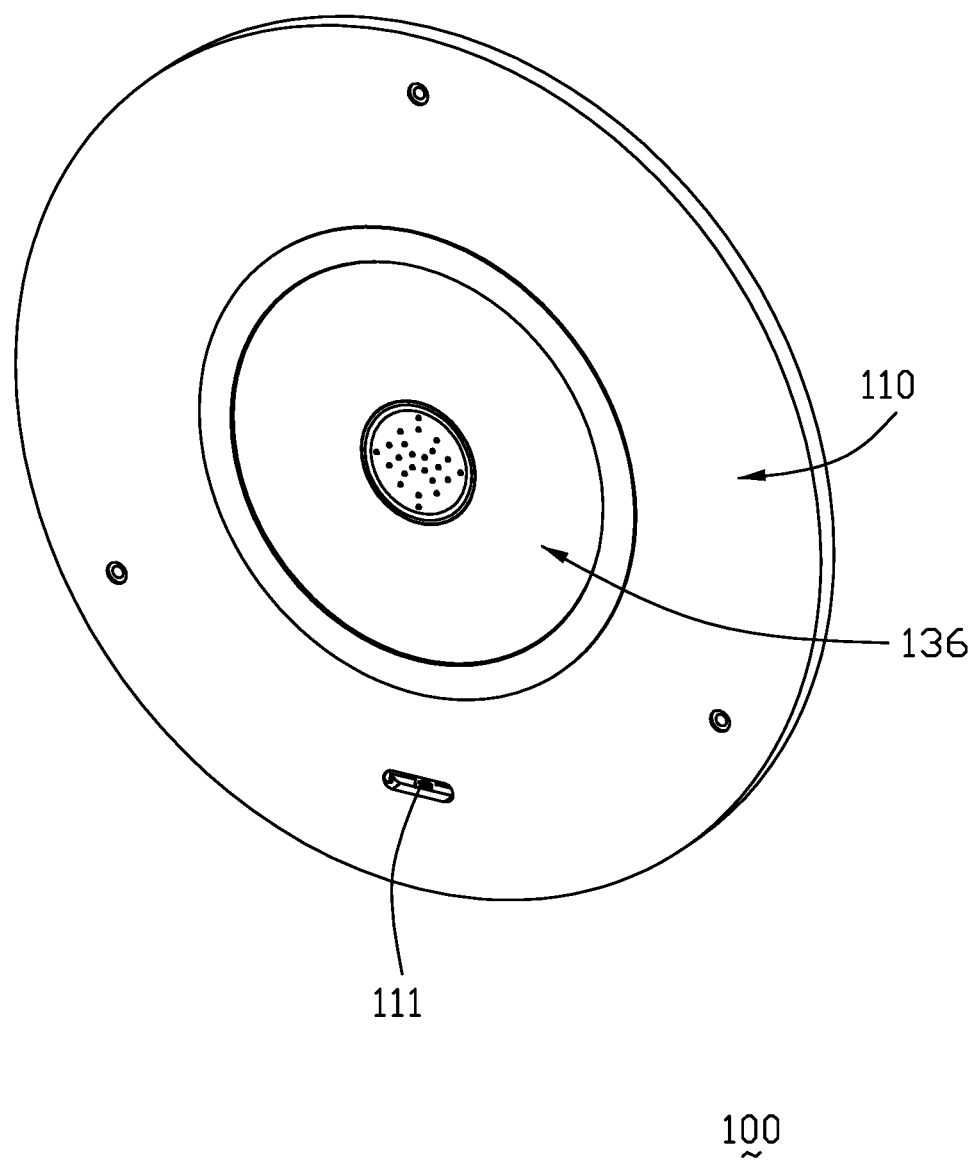
FIG. 1 is a perspective view of a wall-mount kit for use with an interconnection system according to the invention.
Figure 2:
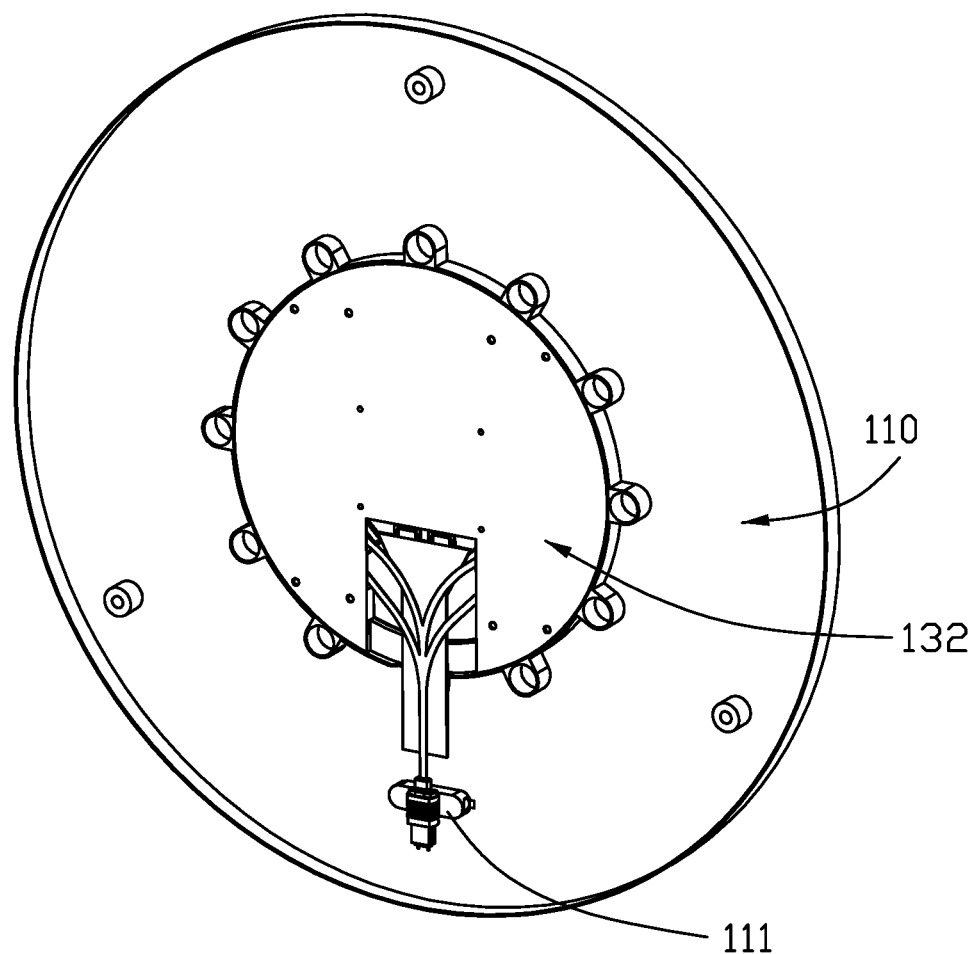
FIG. 2 is an opposite perspective view of the wall-mount kit of FIG. 1.
Figure 3:
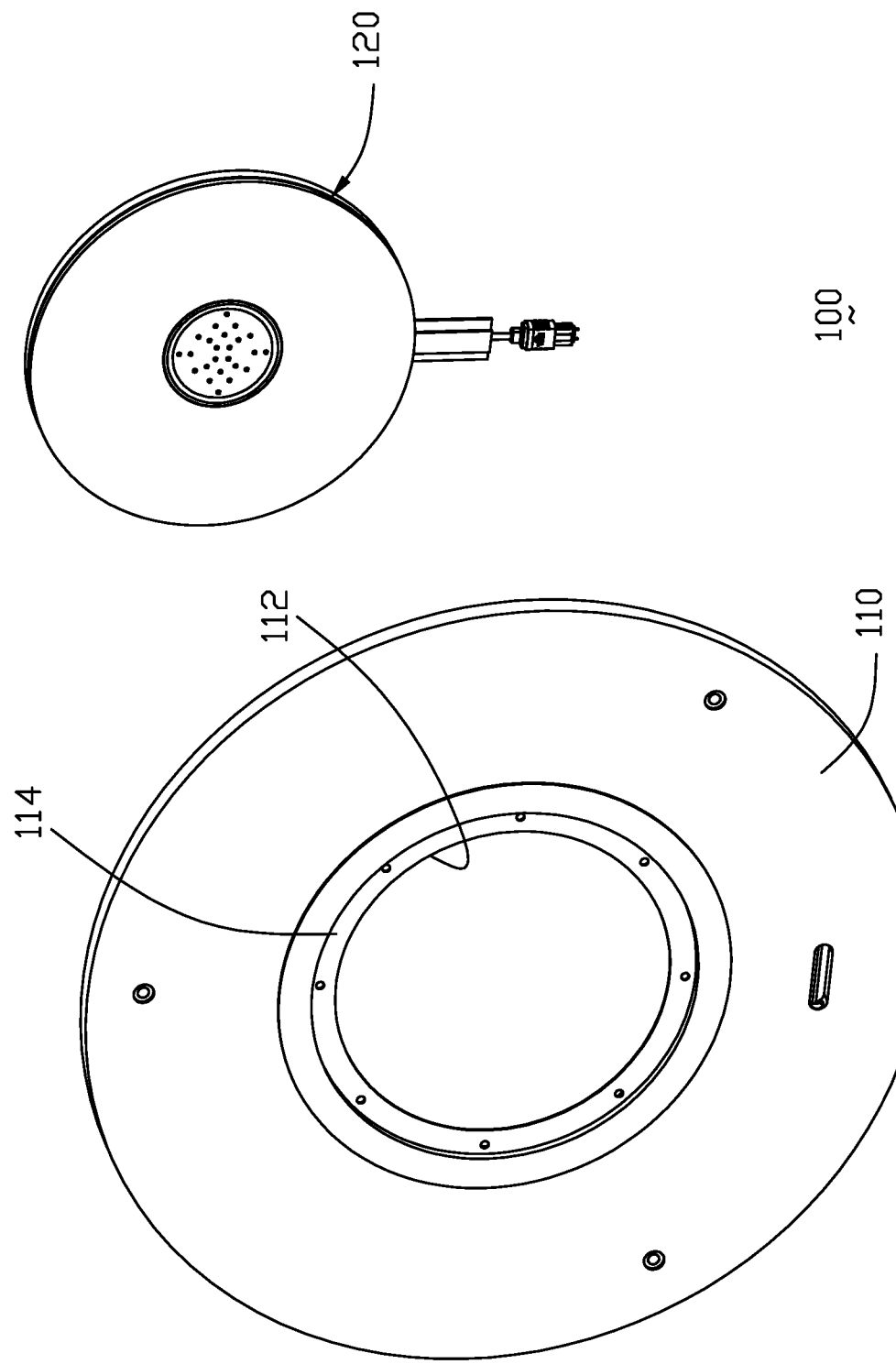
FIG. 3 is an exploded perspective view of the wall-mount kit of FIG. 1.
Figure 3A:
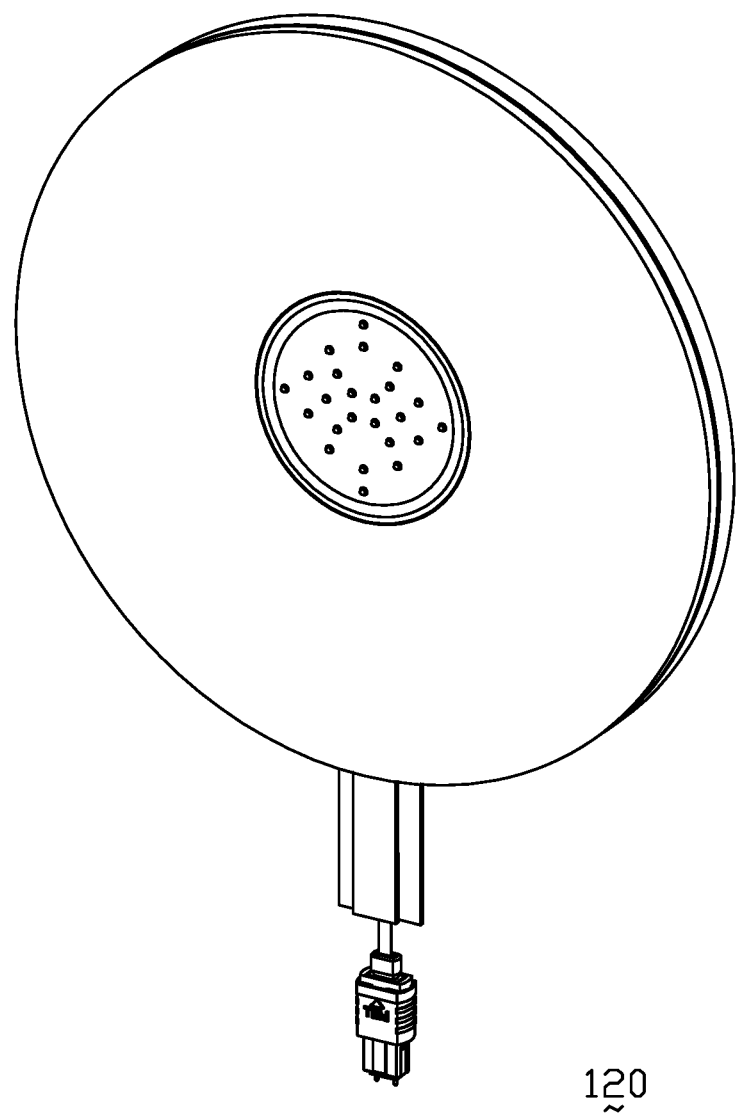
FIG. 3(A) is a perspective view of the core set subassembly of the wall-mount kit of FIG. 3.
Figure 4:
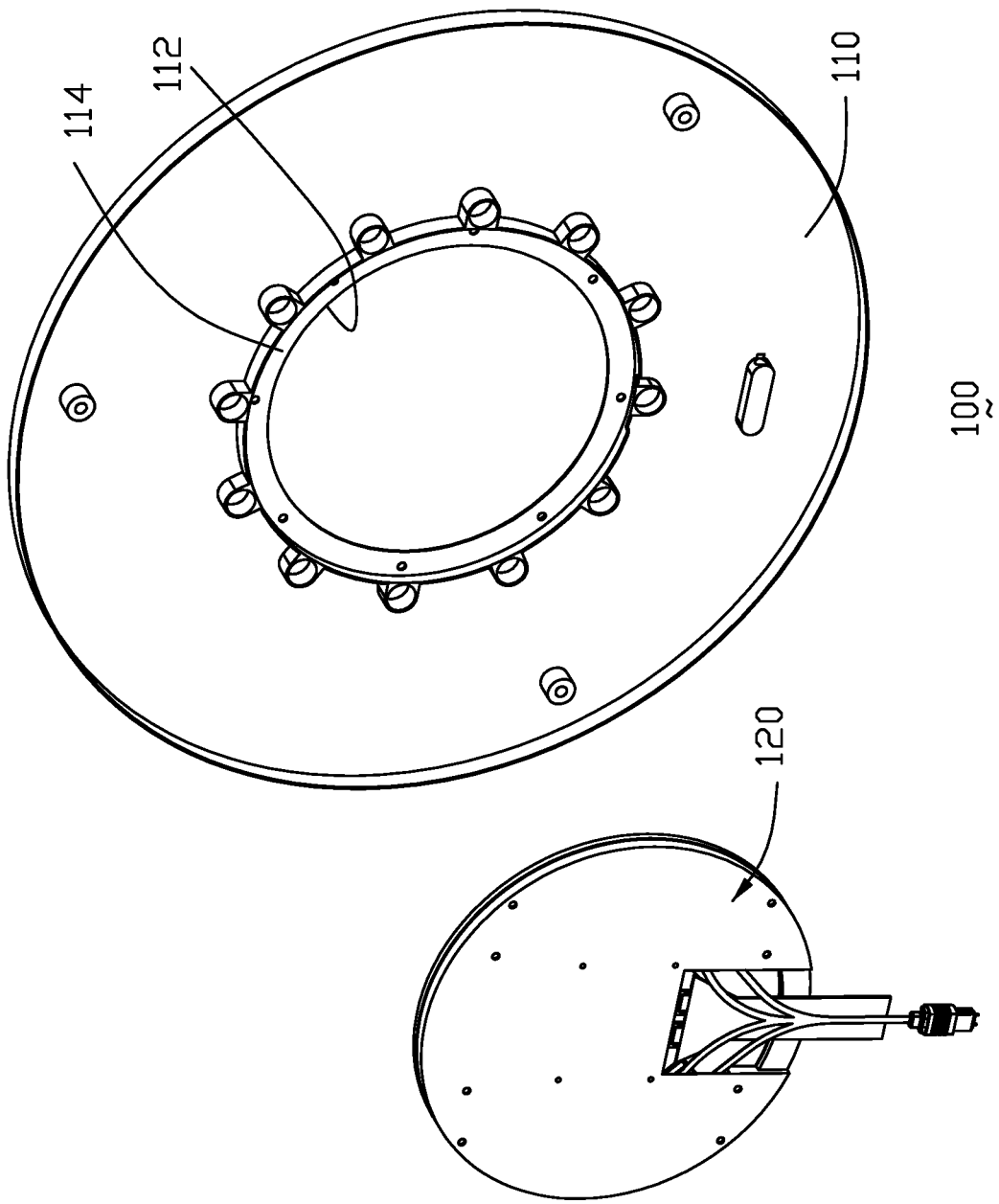
FIG. 4 is an opposite exploded perspective view of the wall-mount kit of FIG. 3.
Figure 4A:
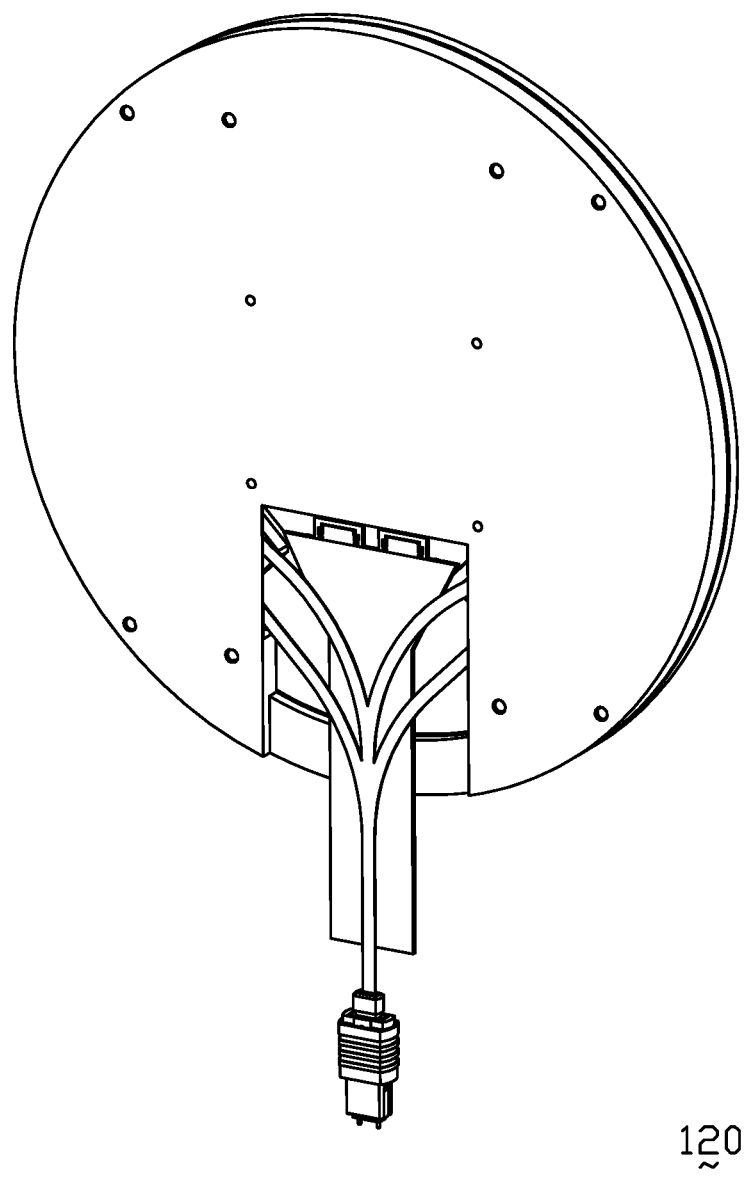
FIG. 4(A) is an opposite perspective view of the core set subassembly of the wall-mount kit of FIG. 3(A)
Figure 5:
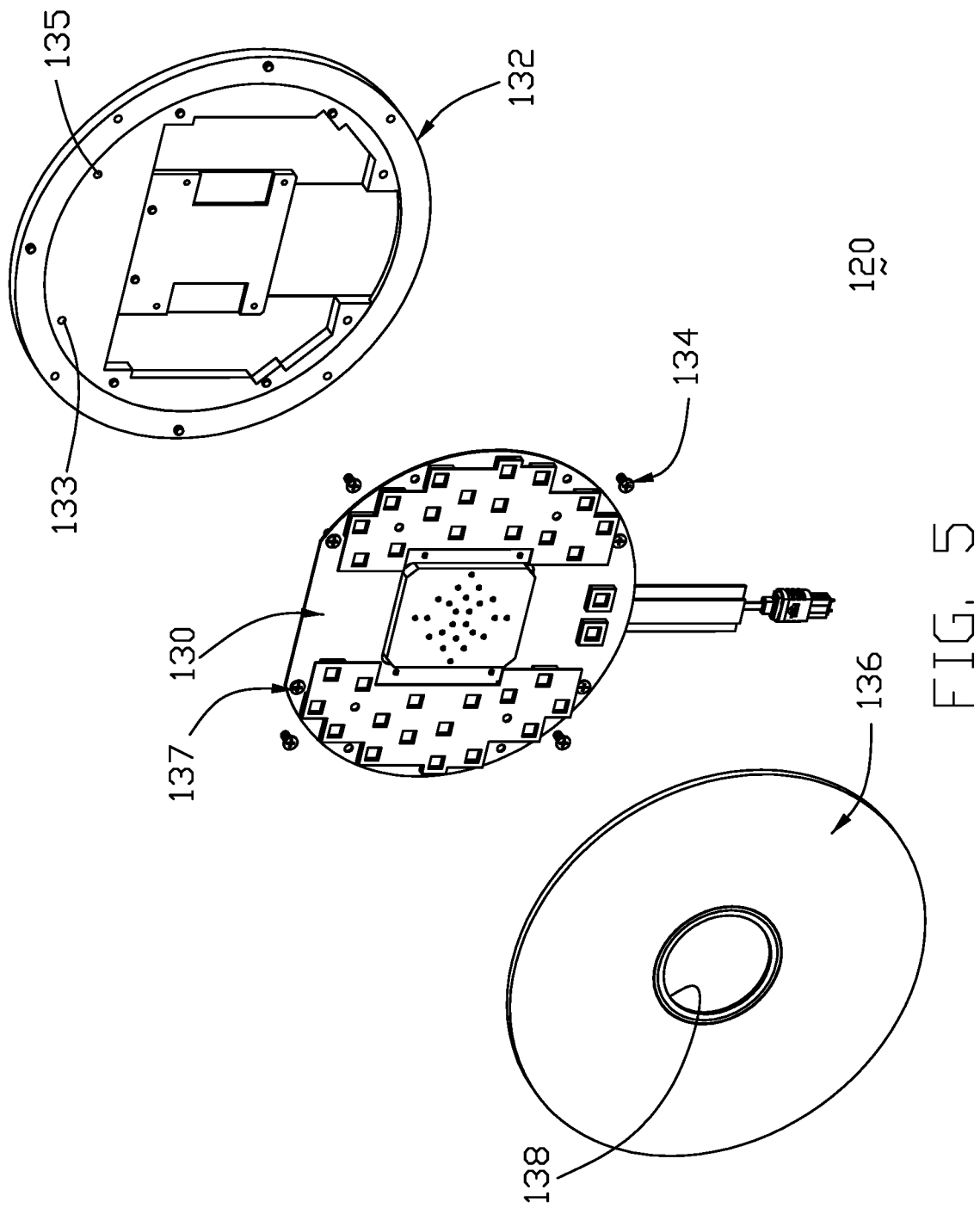
FIG. 5 is an exploded perspective view of the core set subassembly of the wall-mount kit of FIG. 3.
Figure 6:
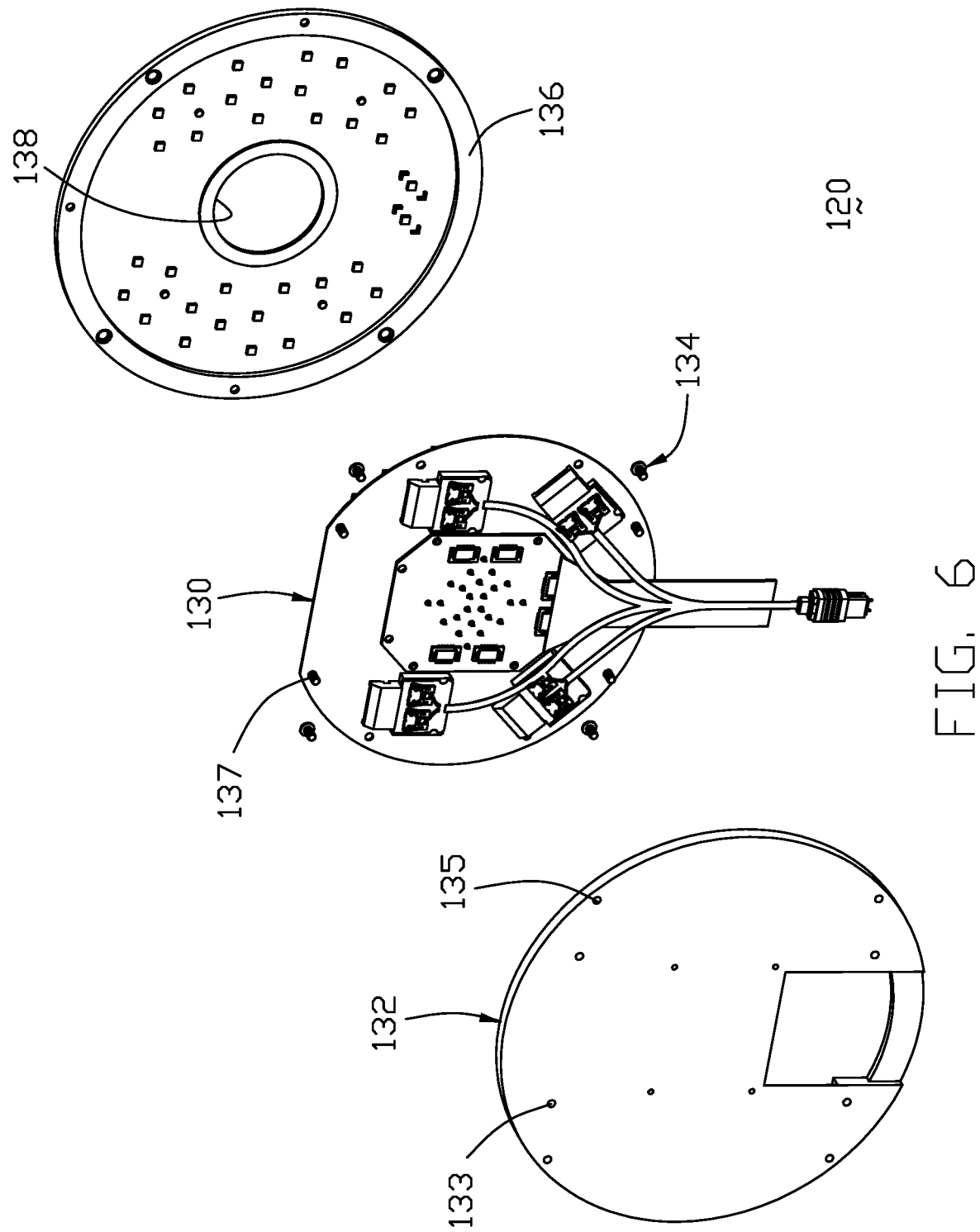
FIG. 6 is an opposite exploded perspective view of the core set subassembly of the wall-mount kit of FIG. 5.
Figure 7:
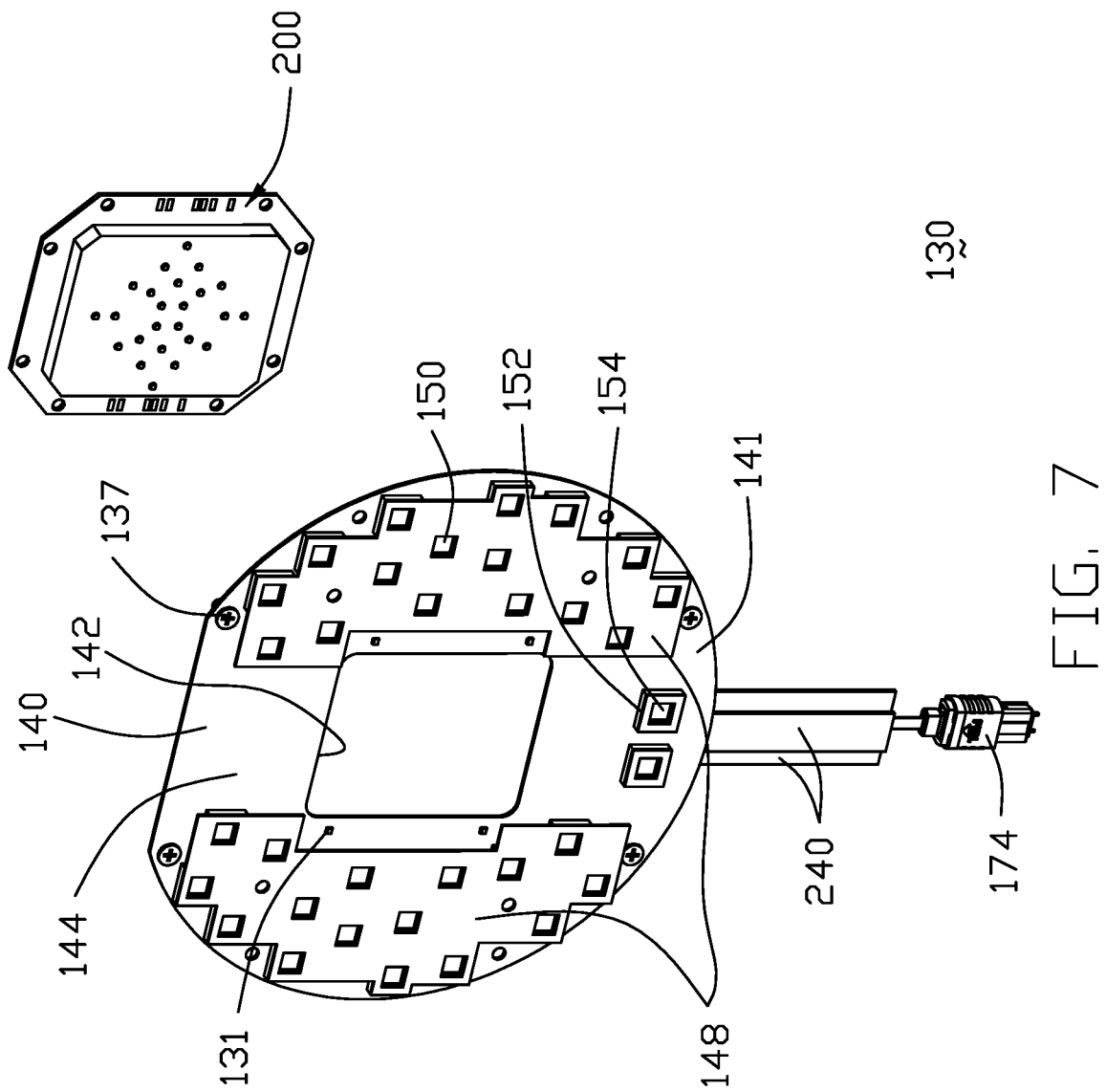
FIG. 7 is a perspective view of the core set of the wall-mount kit of FIG. 1.
Figure 9:
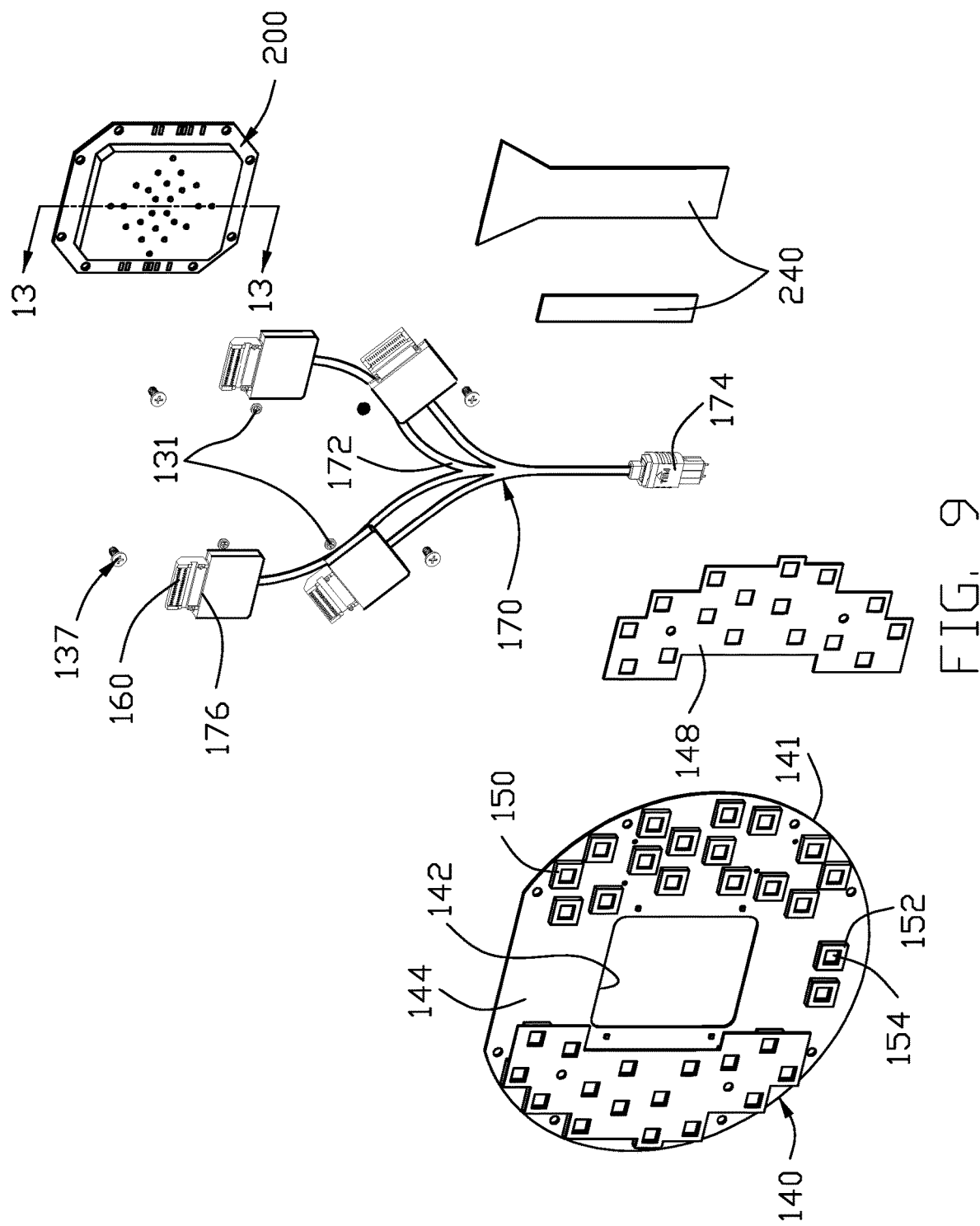
FIG. 9 is a further exploded perspective view of the core set of the wall-mount kit of FIG. 7.
Figure 10:
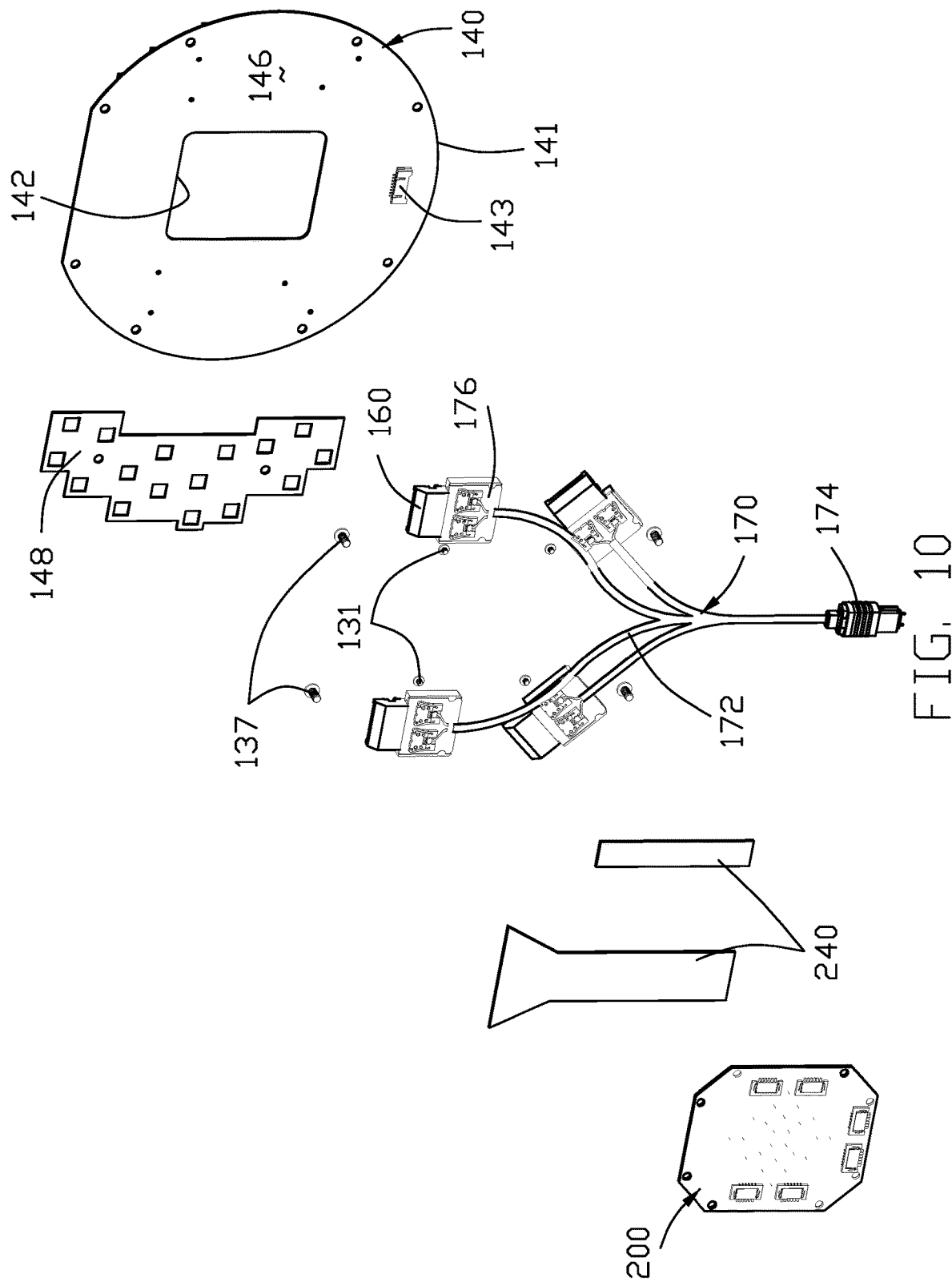
FIG. 10 is an opposite exploded perspective view of the core set of the wall-mount kit of FIG. 9.
Figure 11:
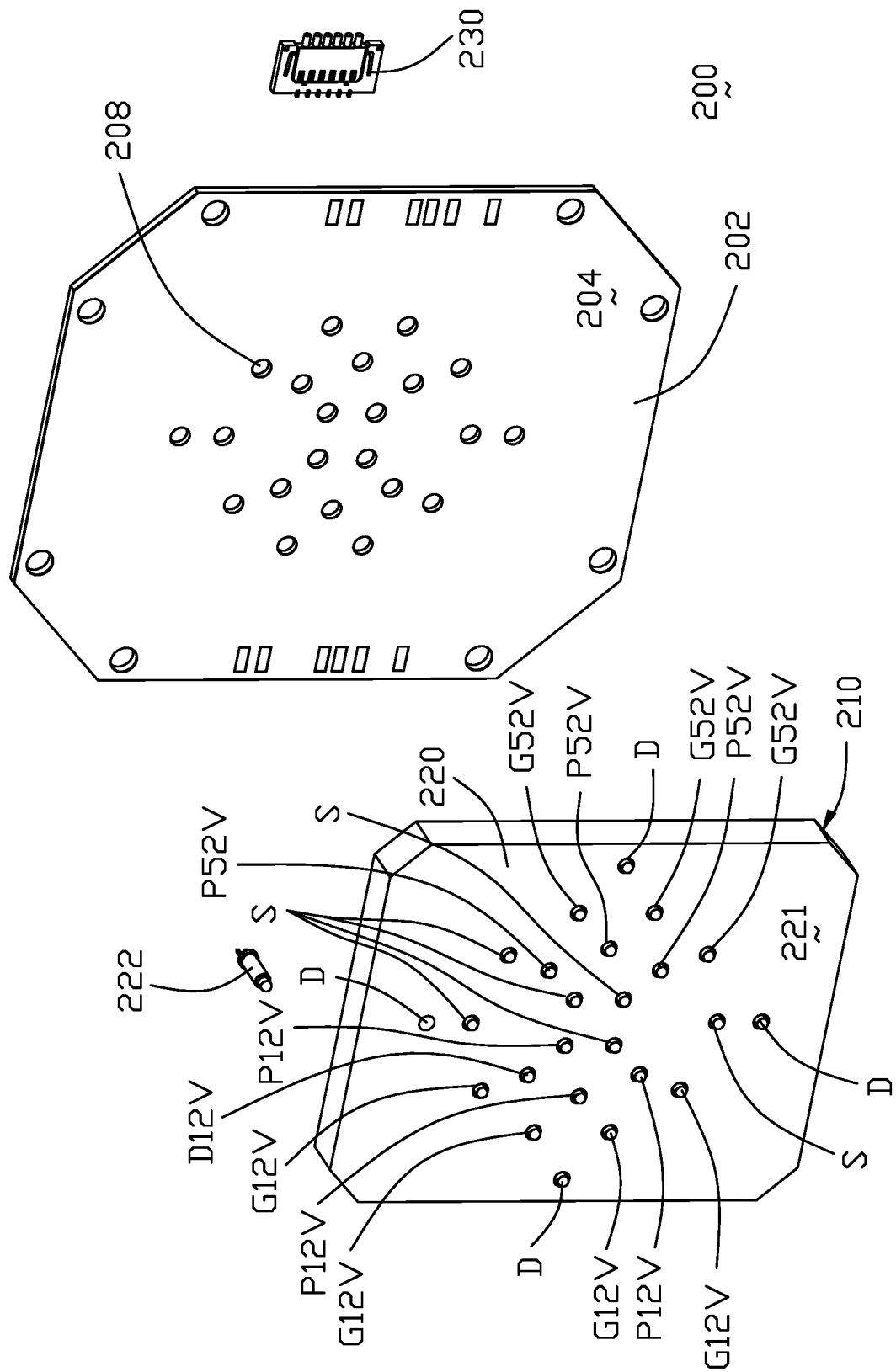
FIG. 11 is an exploded perspective view of the power board module of the core set of the wall-mount kit of FIG. 9.
Figure 13:
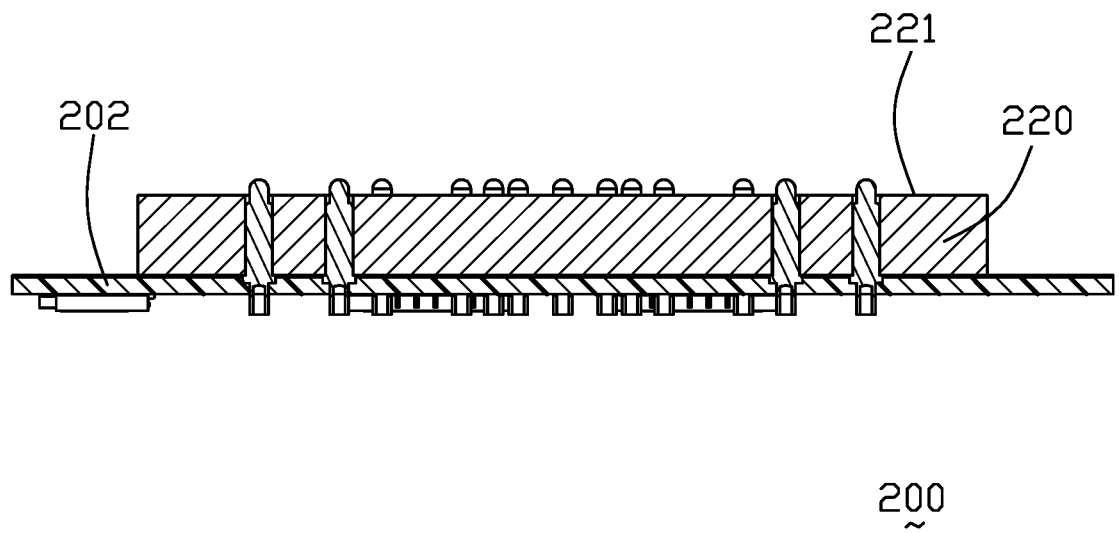
FIG. 13 is a cross-sectional view of the power board module of the core set of the wall-mount kit of FIG. 11.
Figure 14:
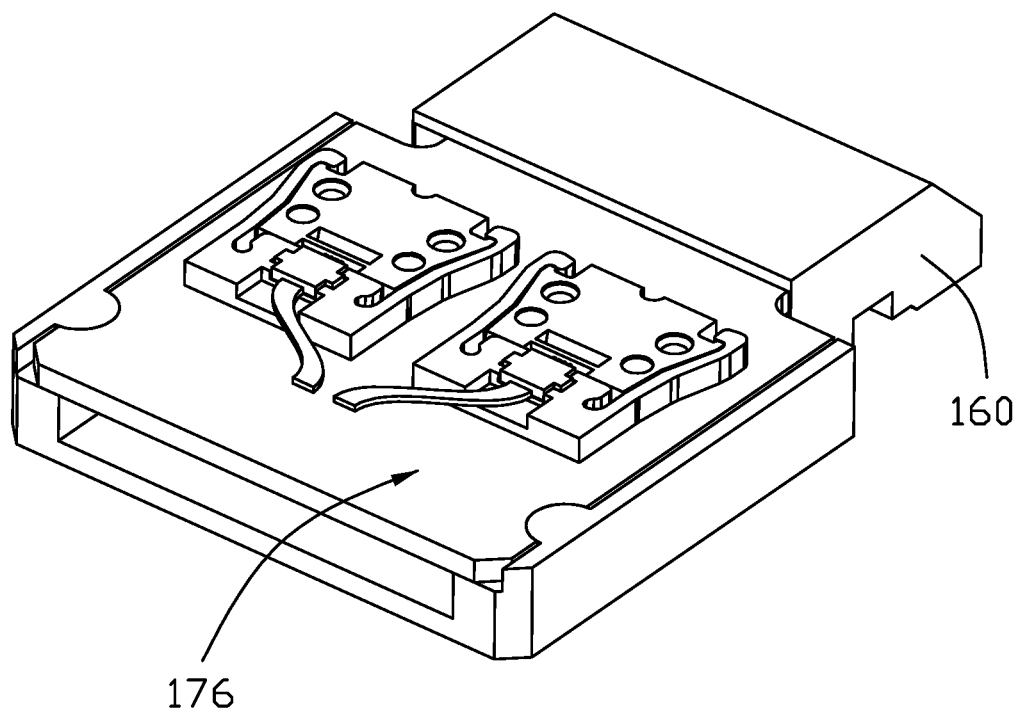
FIG. 14 is a perspective view of the OE module and the QSFP connector of the wall-mount kit of FIG. 1.
Figure 15:
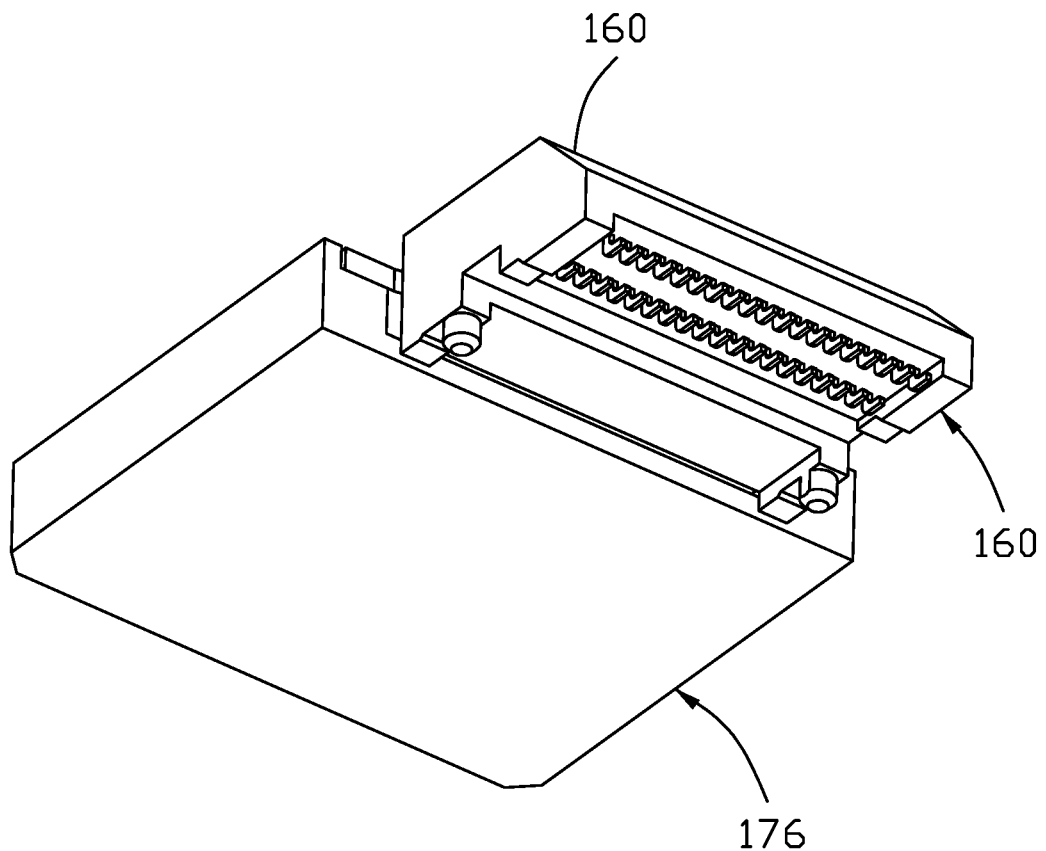
FIG. 15 is an opposite perspective view of the OE module and the QSFP connector of the wall-mount kit of FIG. 14.
Figure 16:
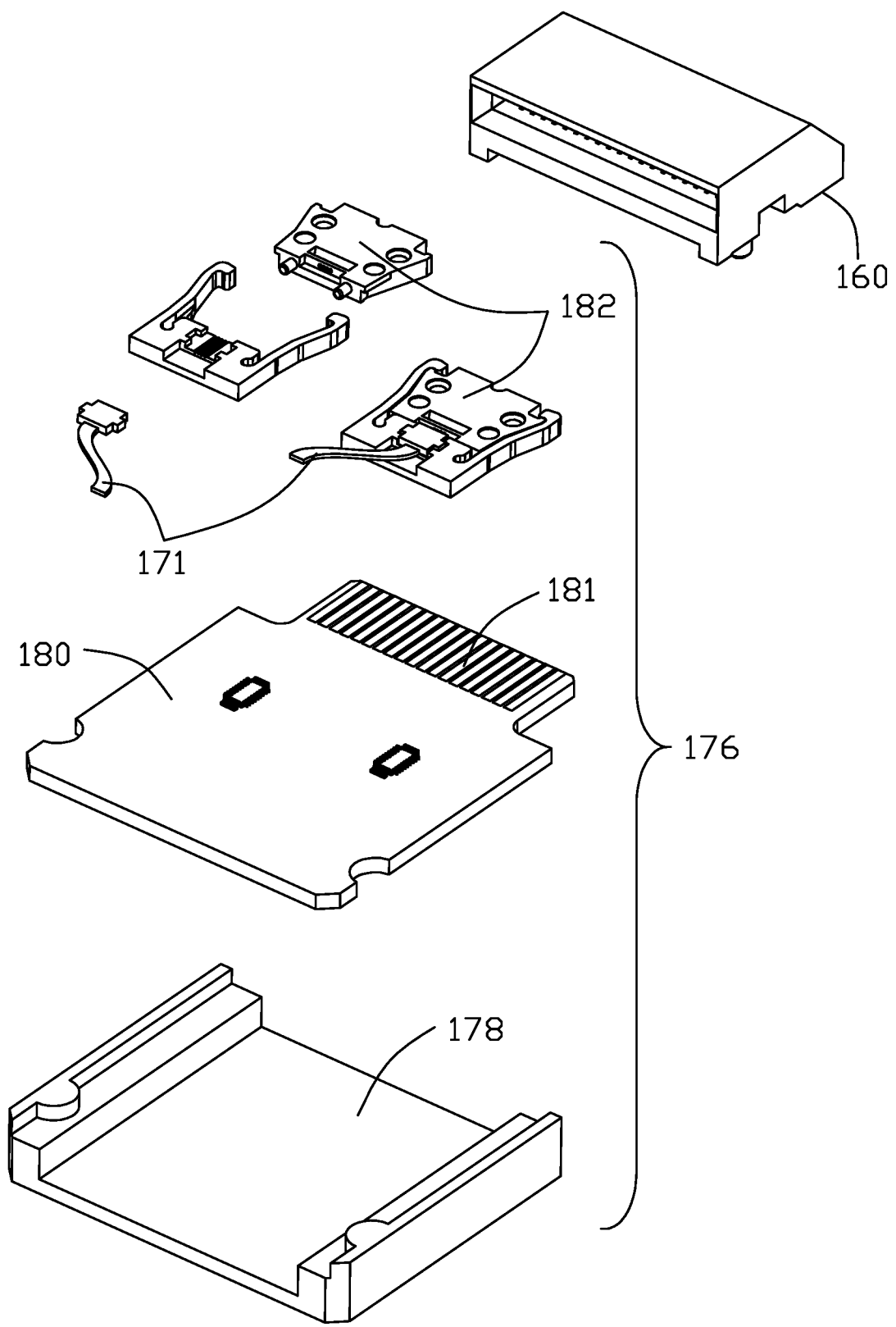
FIG. 16 is a further exploded perspective view of the OE module and the QSFP connector of the wall-mount kit of FIG. 14.
Figure 17:
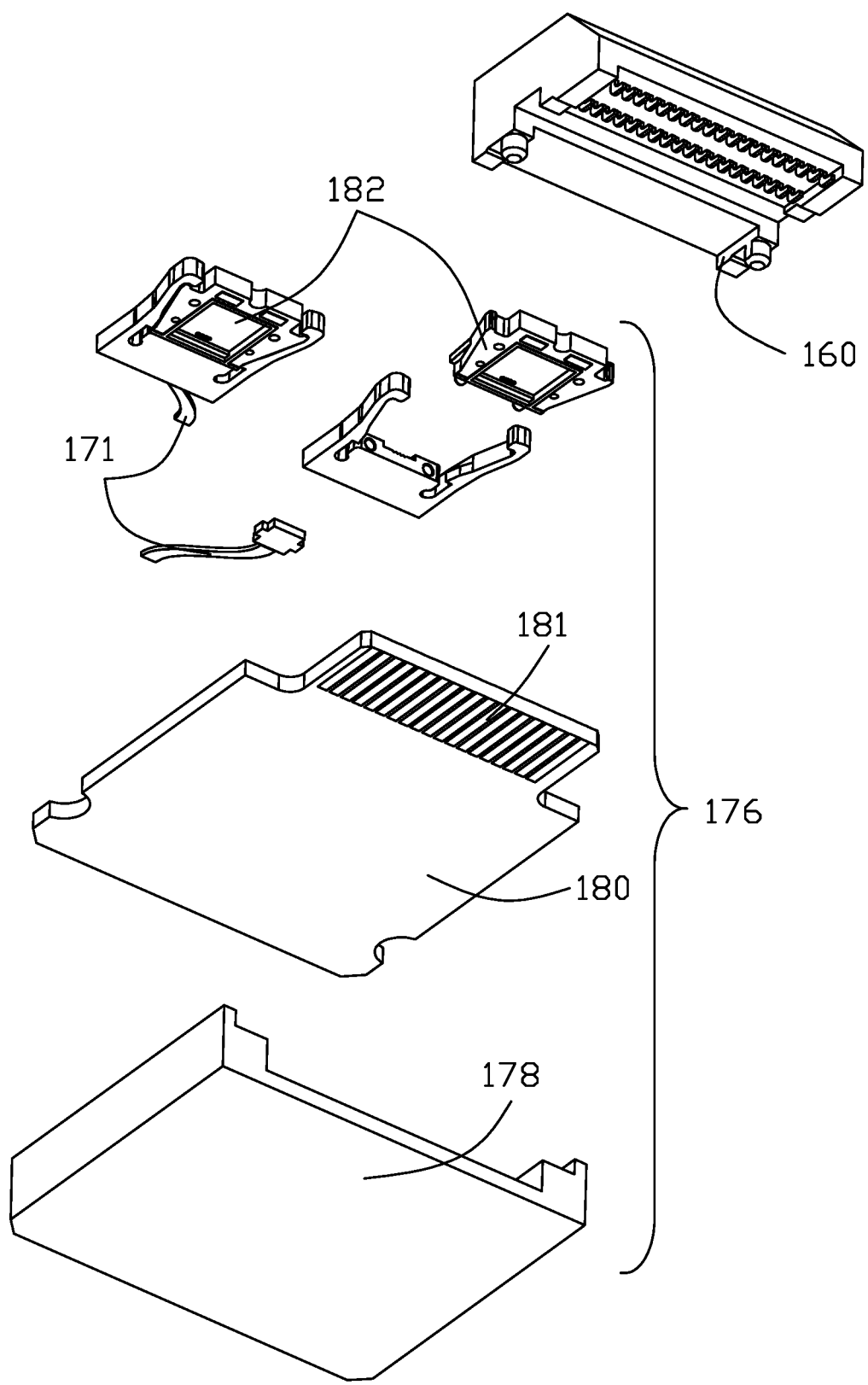
FIG. 17 is an opposite exploded perspective view of the OE module and the QSFP connector of the wall-mount kit of FIG. 15.
Figure 18:
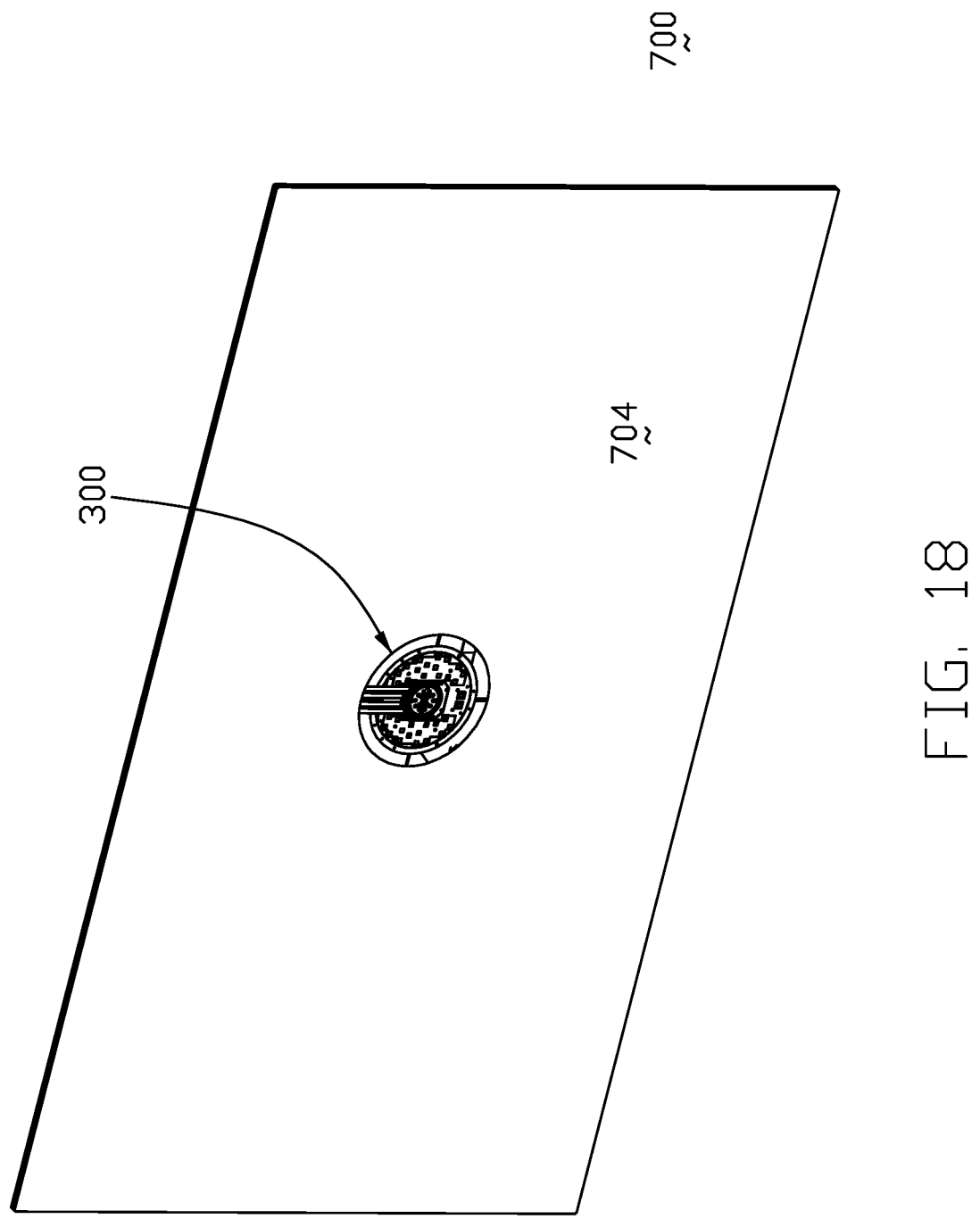
FIG. 18 is a perspective view of the display including the panel-side kit for coupling the wall-mount kit of the interconnection system of FIG. 1.
Figure 19:
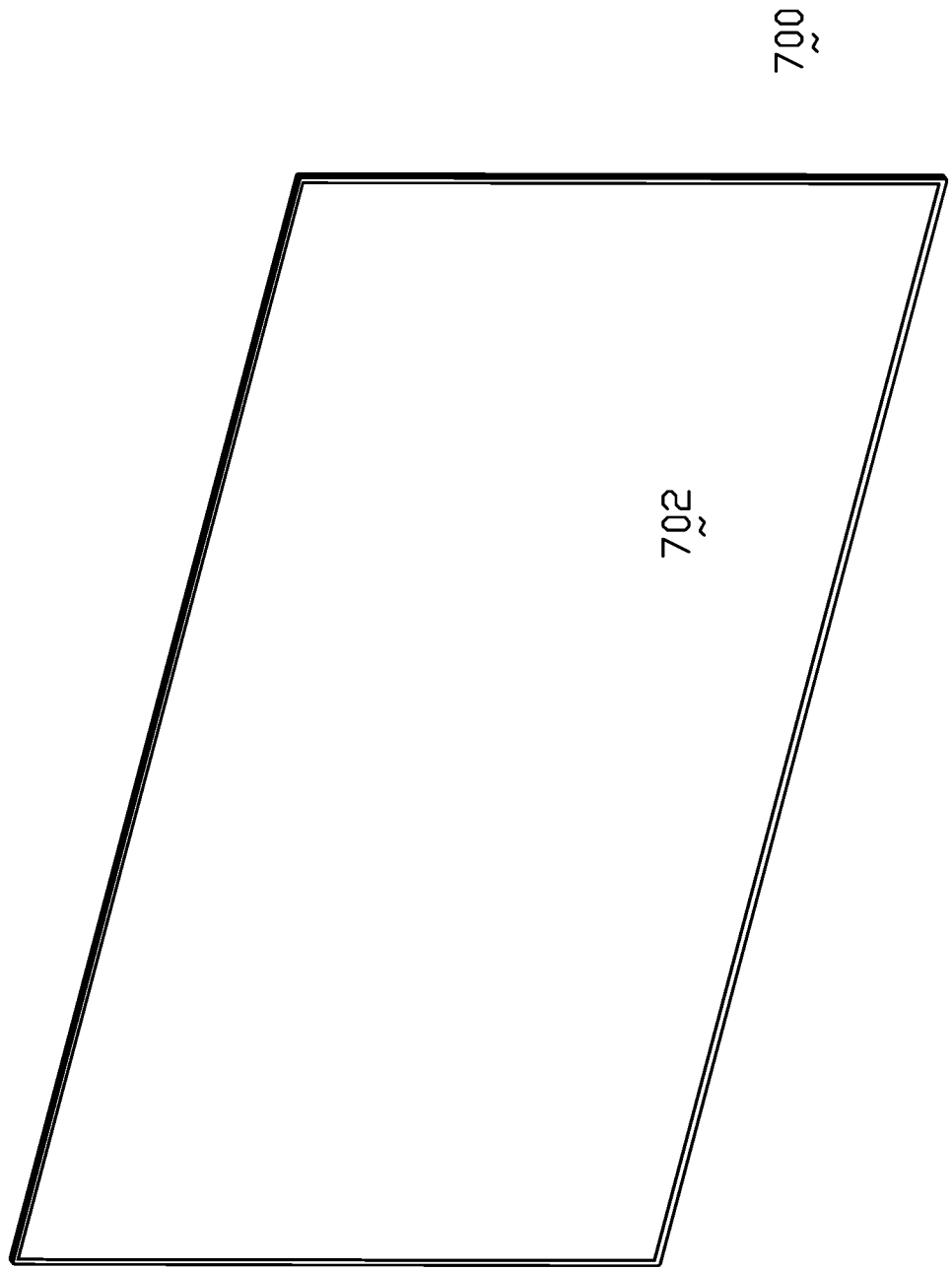
FIG. 19 is an opposite perspective view of the display of FIG. 18.
Figure 20:
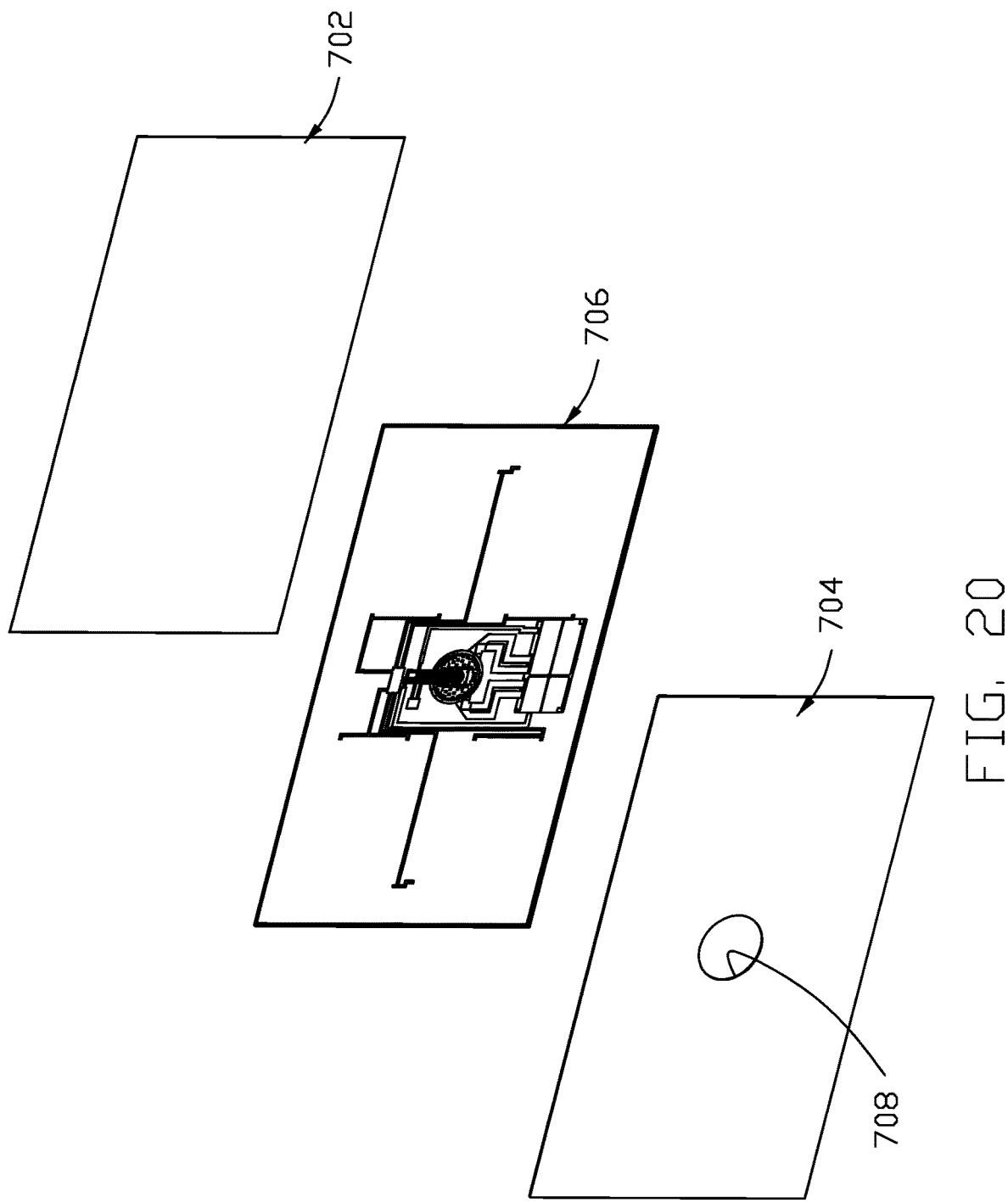
FIG. 20 is an exploded perspective view of the display of FIG. 18.
Figure 21:
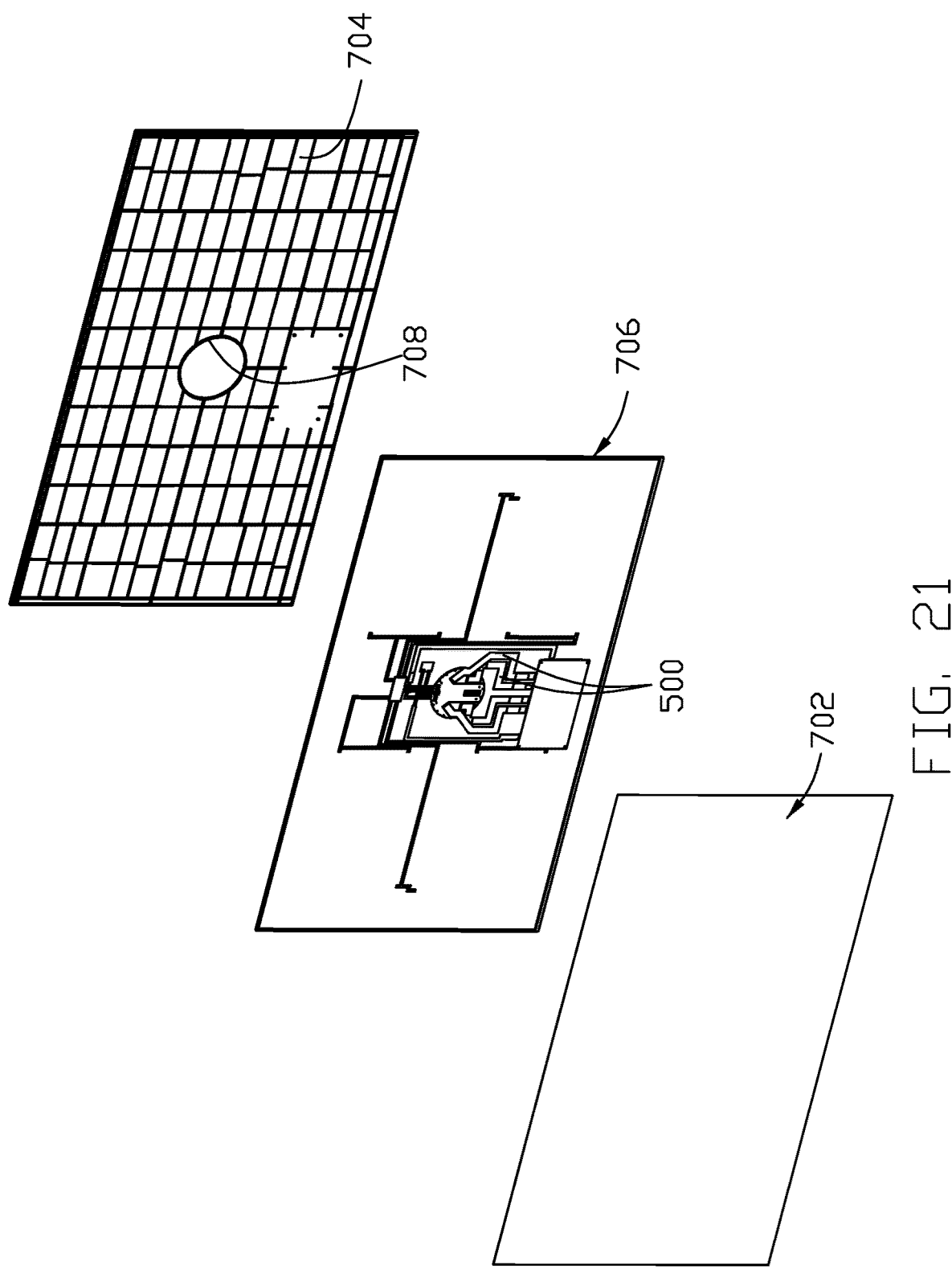
FIG. 21 is an exploded perspective view of the display of FIG. 19.
Figure 22:
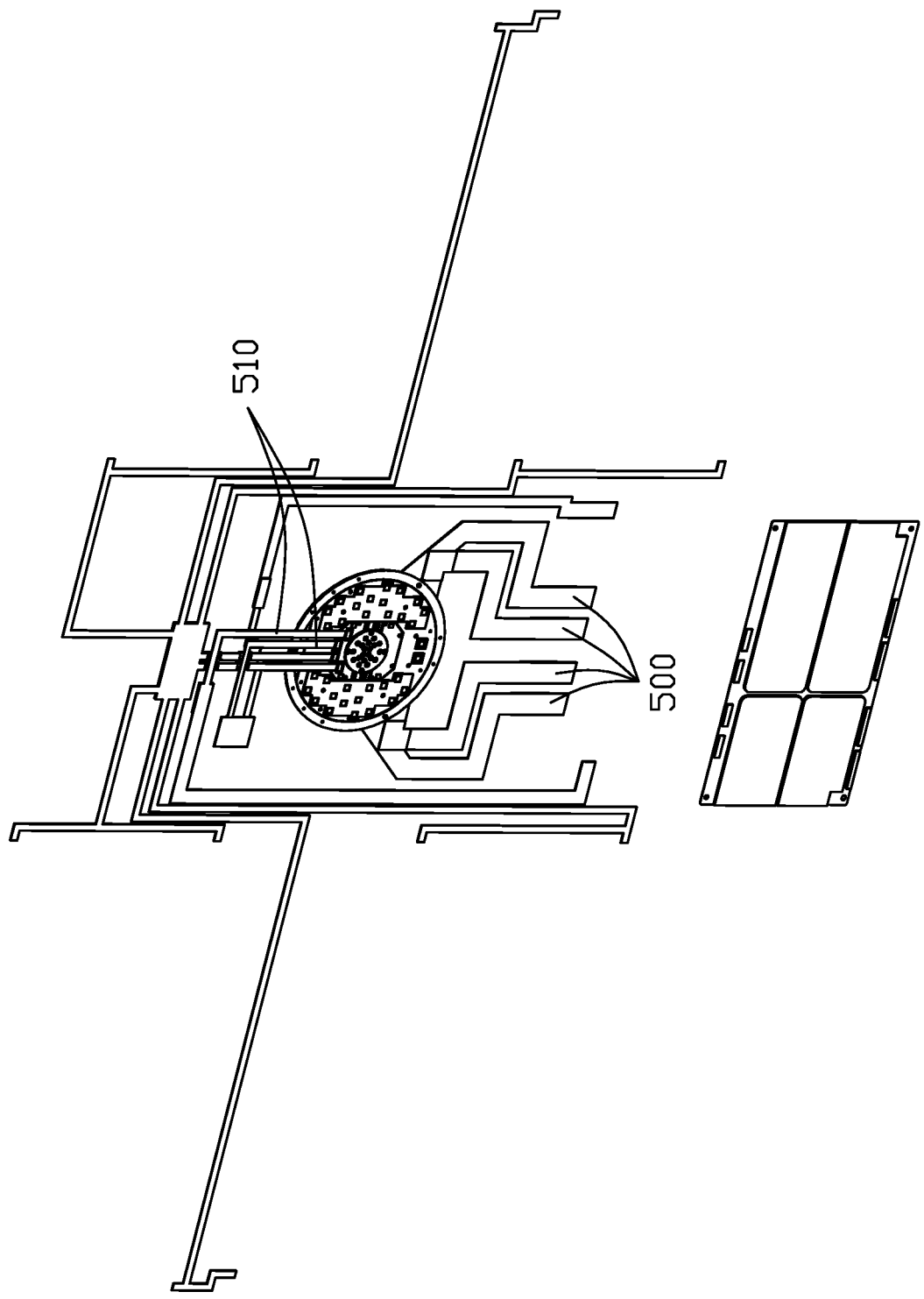
FIG. 22 is a perspective view of the core set subassembly with the associated cables/conductors of the panel-side kit of the display of FIG. 20.
Figure 23:
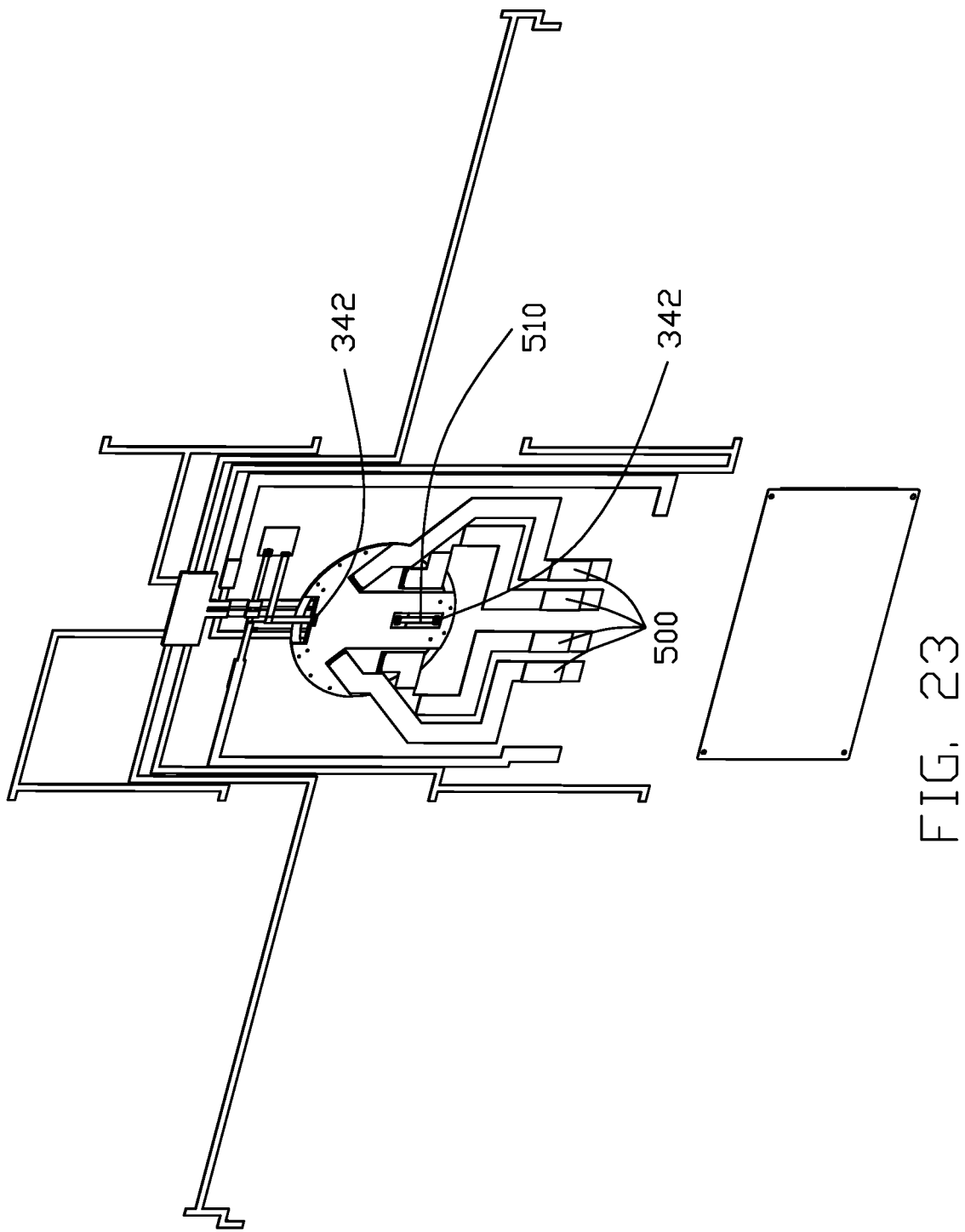
FIG. 23 is a perspective view of the core set subassembly with the associated cables/conductors of the panel-side kit of the display of FIG. 21.
Figure 24:
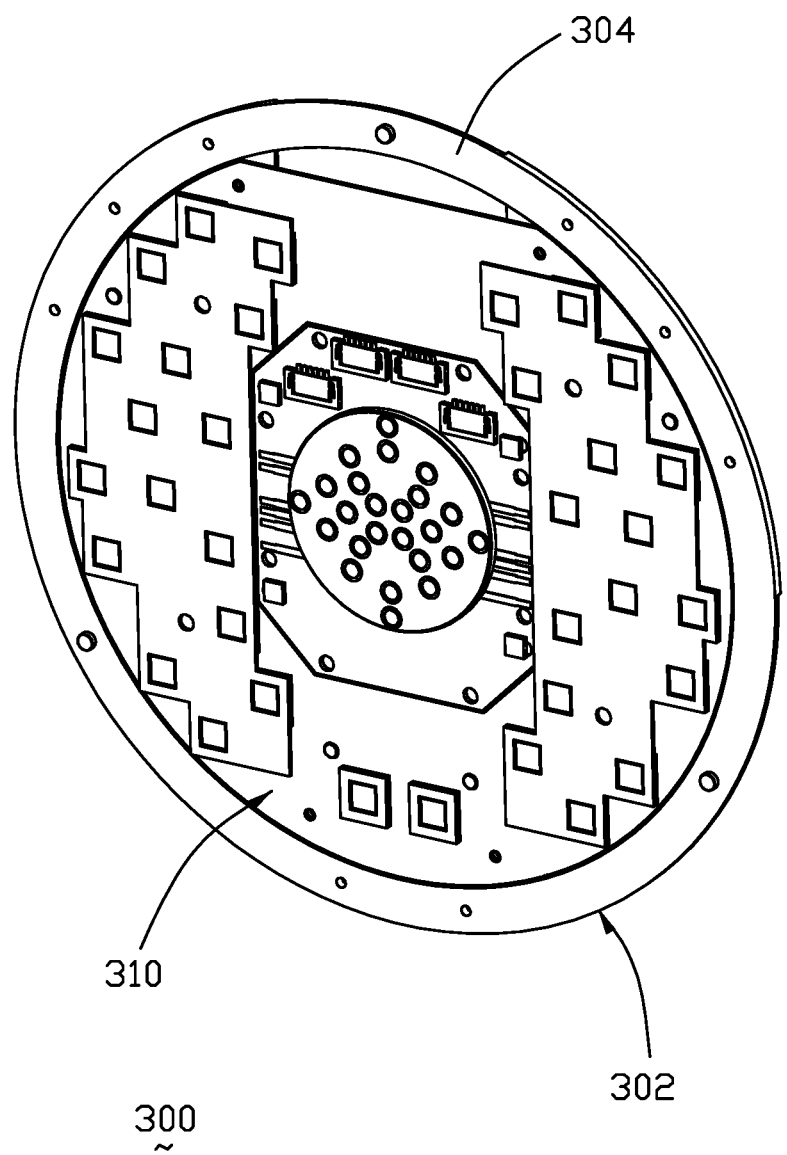
FIG. 24 is a perspective view of the core set subassembly of the panel-side kit of FIG. 22.
Figure 25:
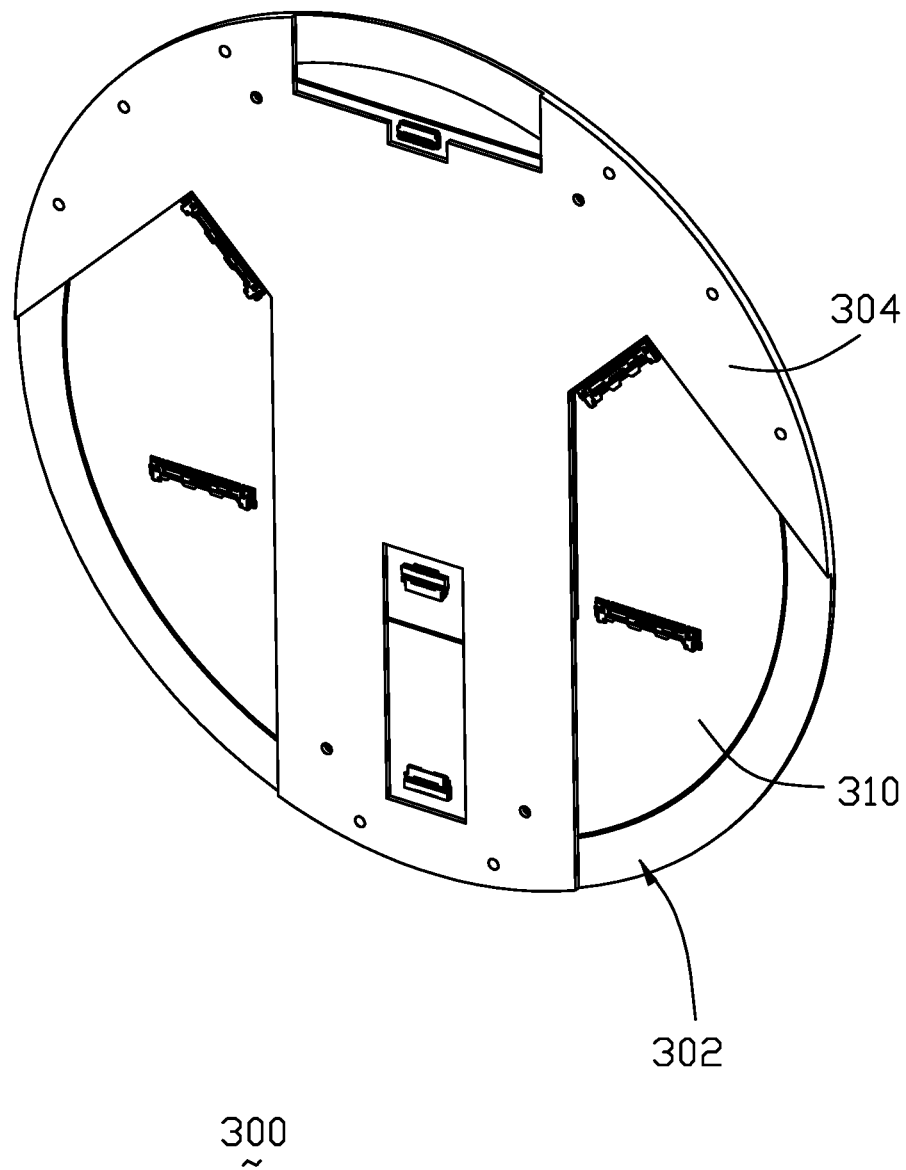
FIG. 25 is a perspective view of the core set subassembly of the panel-side kit of FIG. 23.
Figure 26:
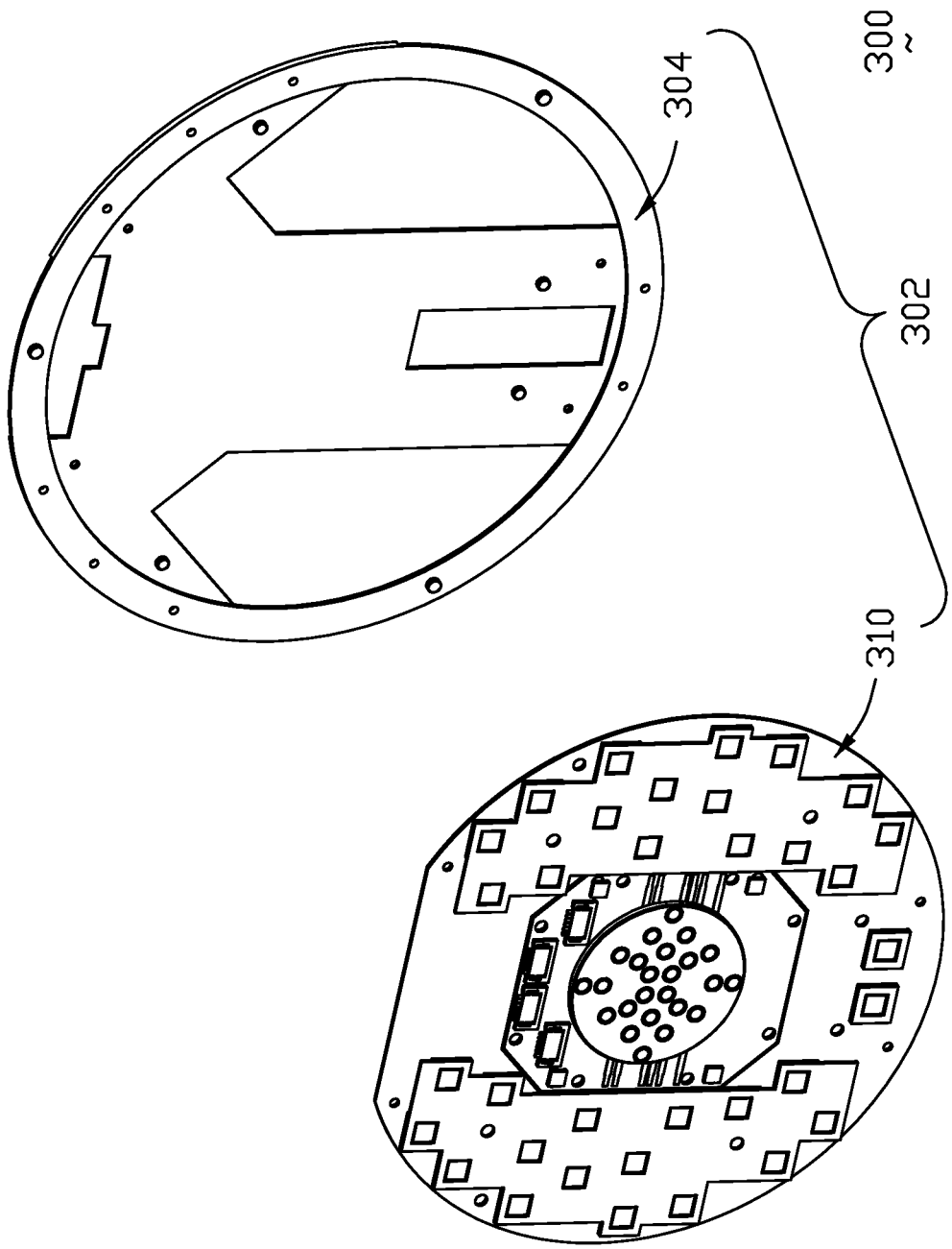
FIG. 26 is an exploded perspective view of the core set subassembly of the panel-side kit of FIG. 24.
Figure 27:
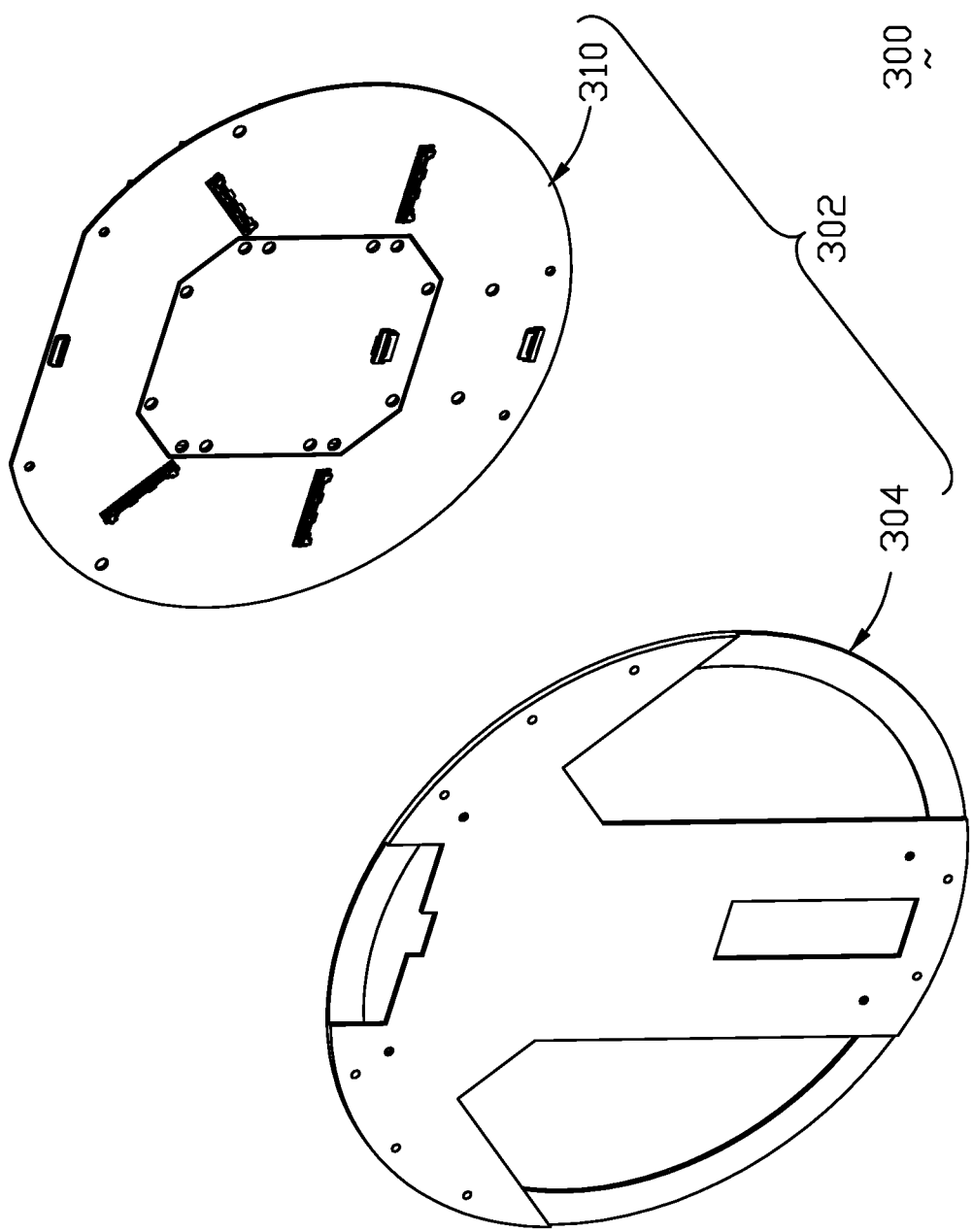
FIG. 27 is an exploded perspective view of the core set subassembly of the panel-side kit of FIG. 25.
Figure 28:
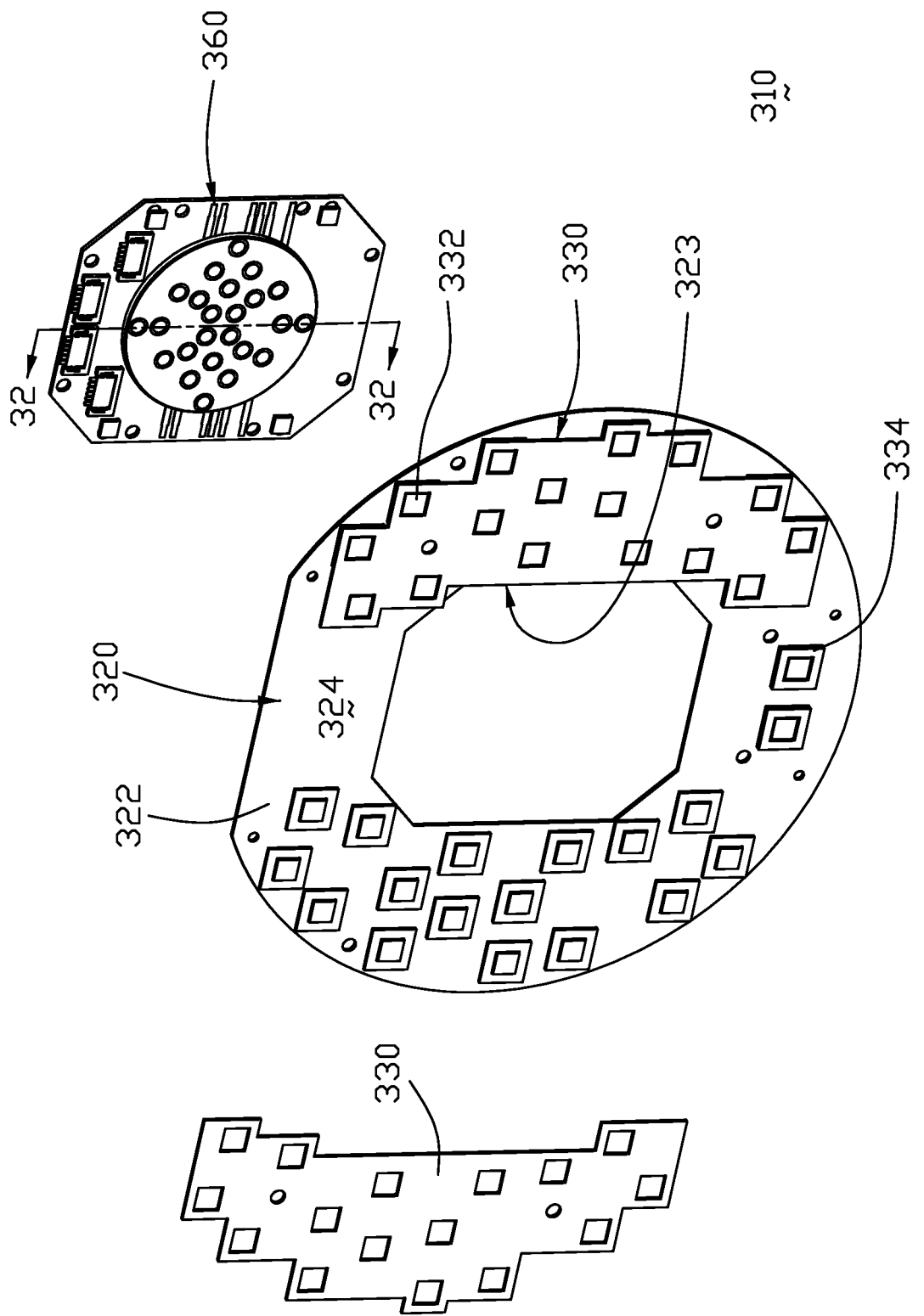
FIG. 28 is an exploded perspective view of the core set of the panel-side kit of FIG. 26.
Figure 29:
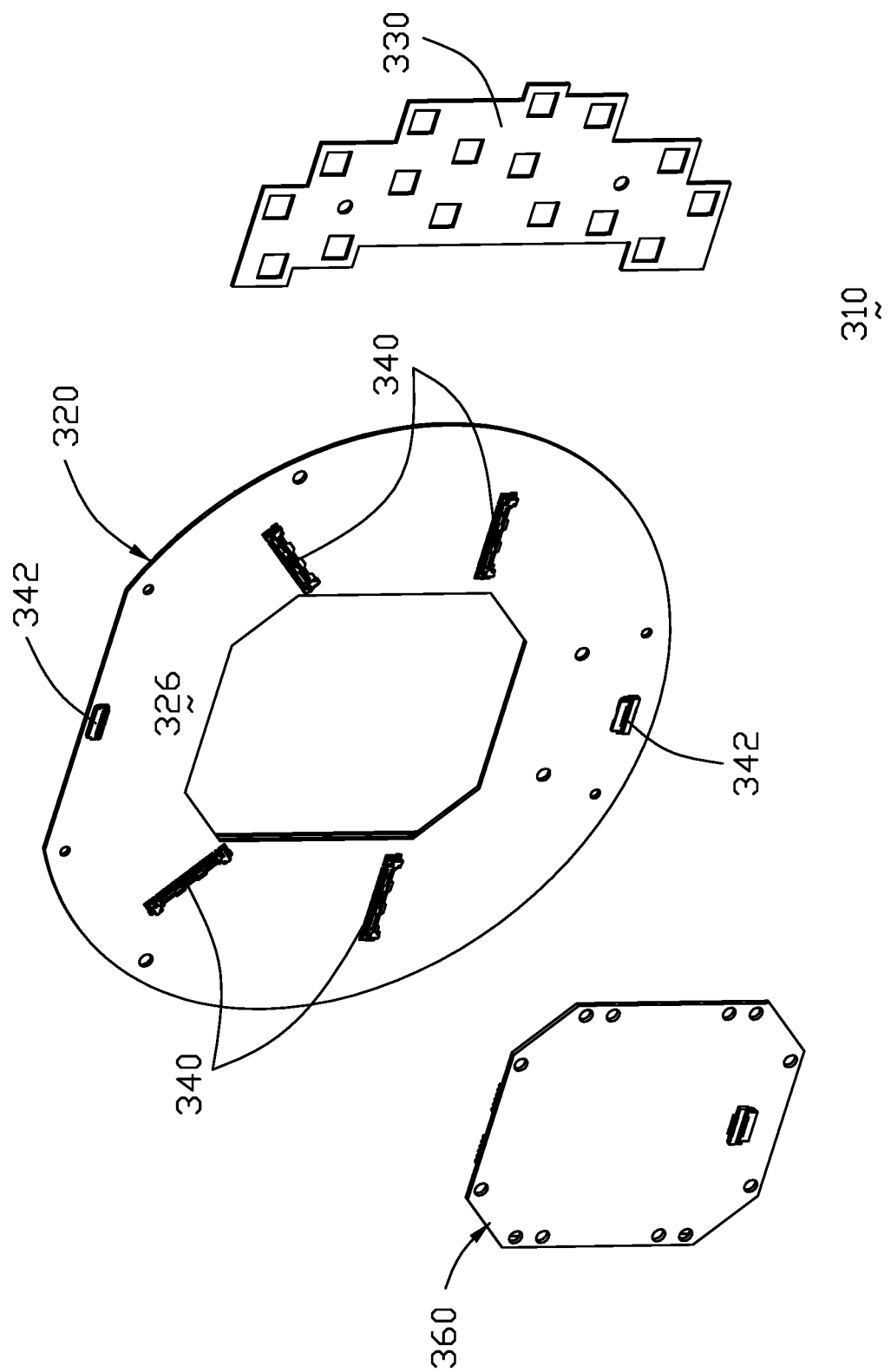
FIG. 29 is an exploded perspective view of the core set of the panel-side kit of FIG. 27.
Figure 30:
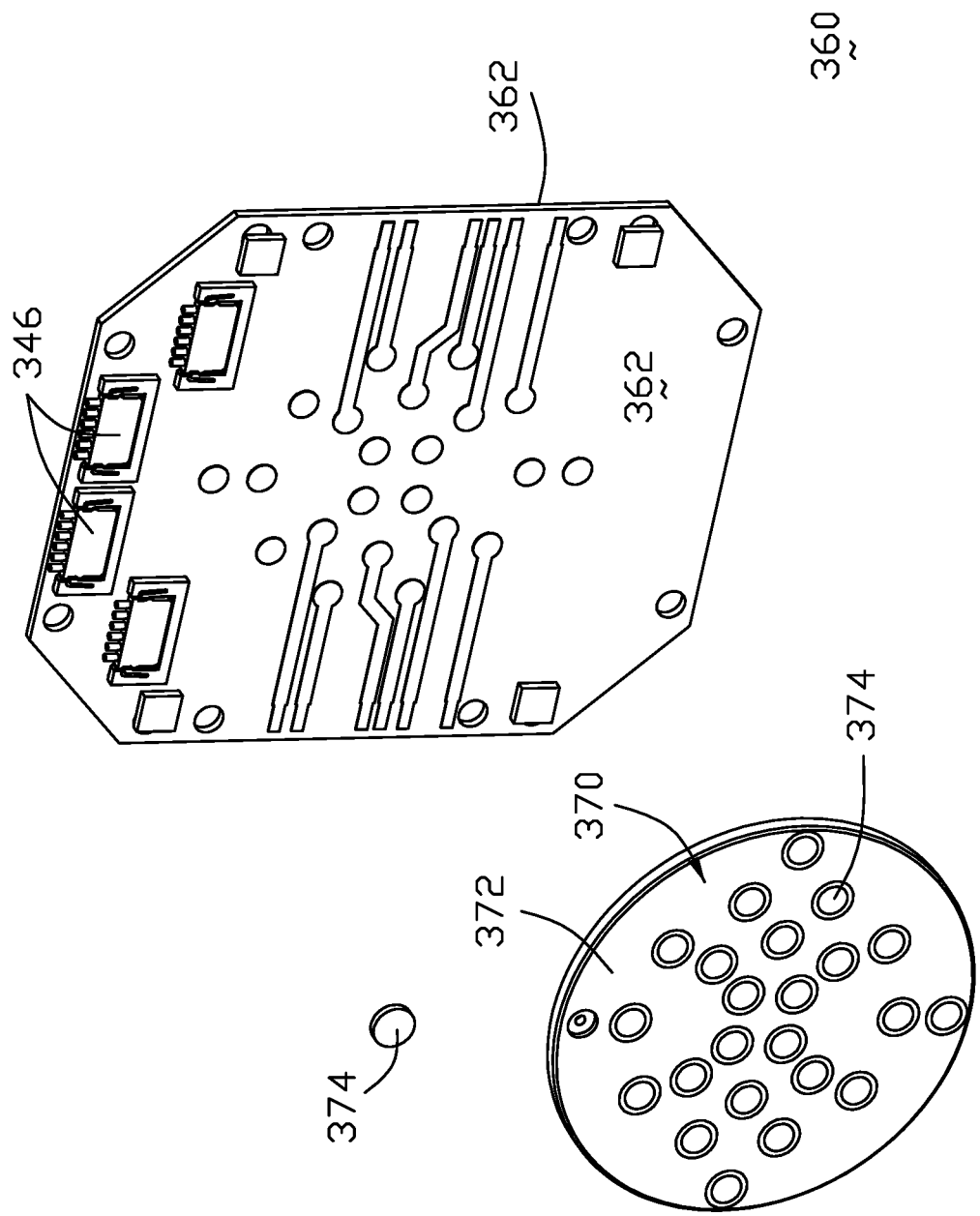
FIG. 30 is an exploded perspective view of the power board module of the panel-side kit of FIG. 28.
Figure 31:
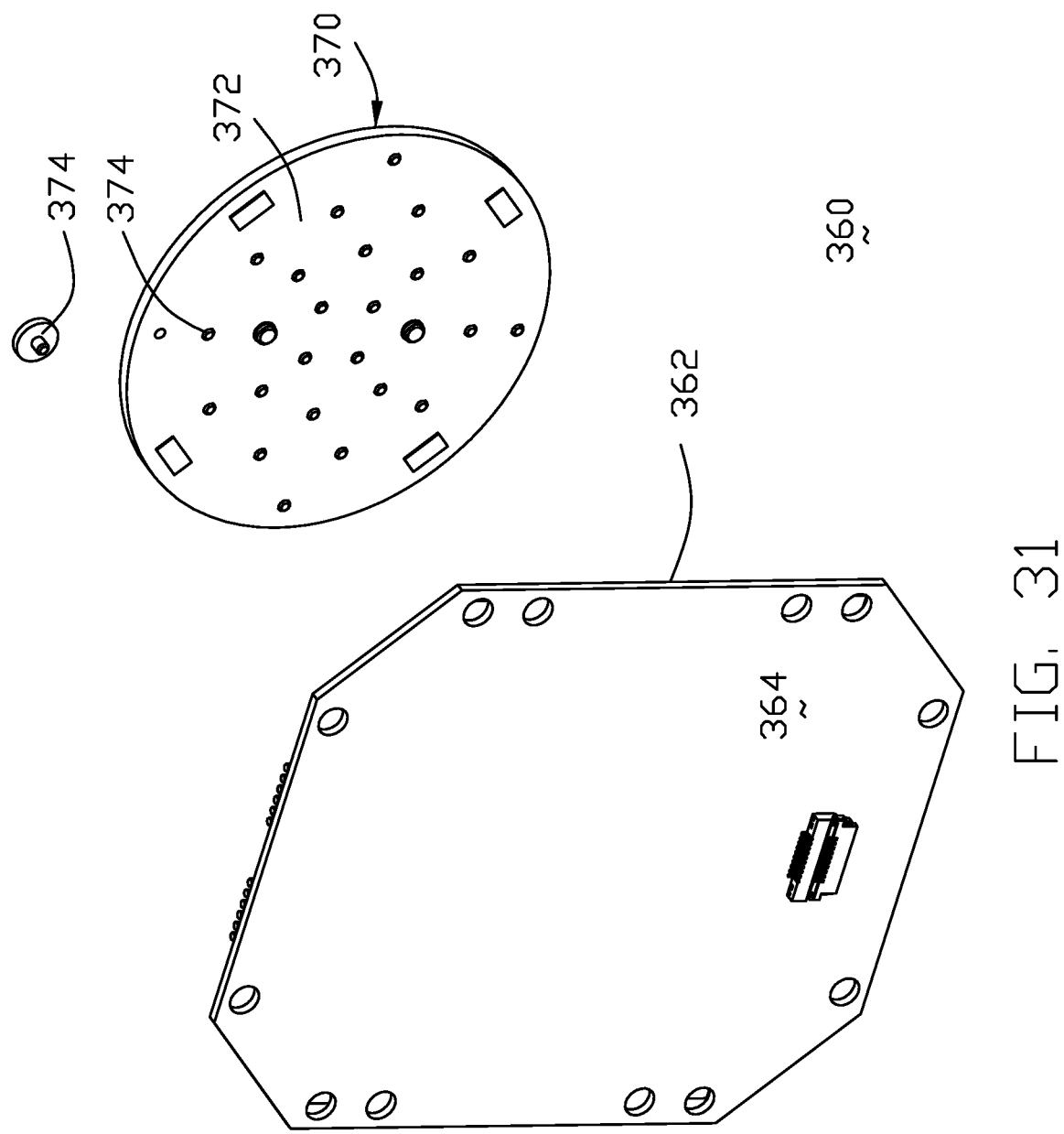
FIG. 31 is an exploded perspective view of the power board module of the panel-side kit of FIG. 29.
Figure 32:
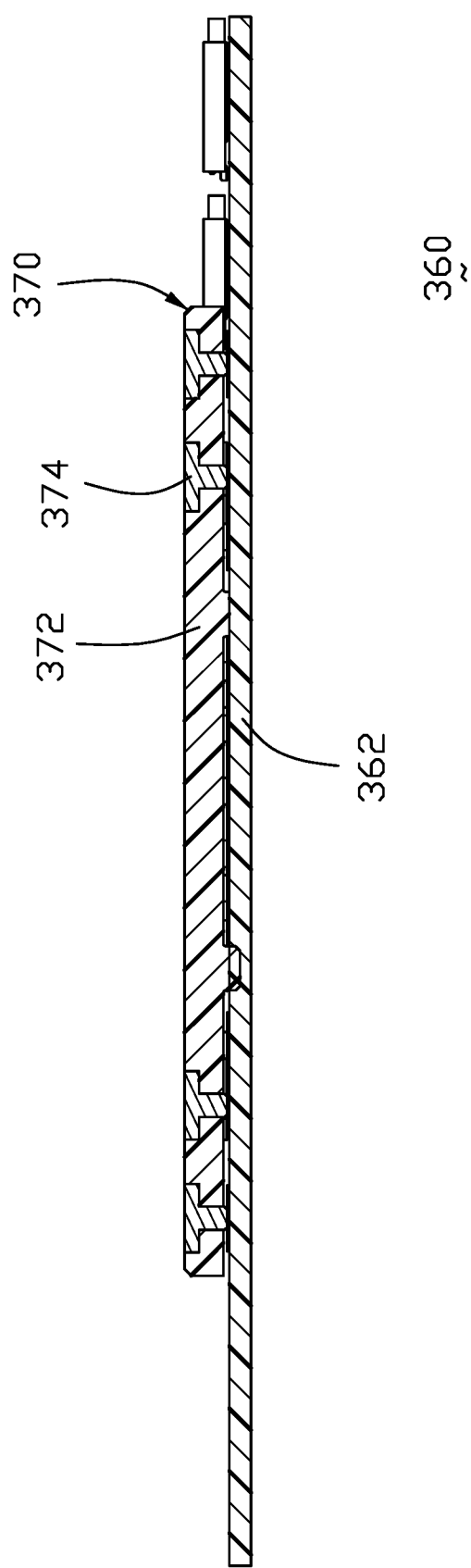
FIG. 32 is a cross-sectional view of the power board module of the panel-side kit of FIG. 30.

An interconnection system for use between a display and a wall-mount seat, includes a wall-mount kit 100 and a panel-site kit 300.

Referring to FIGS. 1-6, the wall-mount kit 100 includes a bracket 110 forming in a center region a circular space 112 in which a (first) core set subassembly 120 is assembled. The bracket 110 includes a level meter 111. The (first) core set subassembly 120 includes a (first) core set 130 attached to a (first) back plate 132 via screws 137 through the corresponding holes 133 of the back plate 132, and further to be commonly assembled to the bracket 110 via the screws 134 through the holes 135 of the back plate 132 upon the rim 114 of the bracket 110, and a (first) insulative cover 136 adhered to the rim 114 with a center opening 138 therein. Therefore, the cover 136 and the (first) core set subassembly 120 commonly sandwich the rim 114 therebetween.

Further referring to FIGS. 7-17, the (first) core set 130 includes a (first) main printed circuit board assembly 140, the Keyssa® board module, including a (first) main printed circuit board 141 with opposite first/coupling surface 144 and second/connecting surface 146, a circular periphery and a center opening 142. KEYSSA is a registered trademark of Keyssa, Inc., Campbell, Calif. A pair of wireless transmitter/transmitting modules 148 are located on the coupling surface 144 at two sides of the opening 142. Each of the wireless transmitter modules 148 includes a plurality of IC packages 150 for extremely high frequency and/or ultra high speed transmission as disclosed in the aforementioned U.S. Pat. No. 8,909,135. In this embodiment, the plurality of packages 150 are largely dispersed on the main printed circuit board 141 except the center opening 143. A pair of transmitter modules 152 with the corresponding IC package 154 are located below the opening 142 for the low speed transmission.

Four electrical QSFP (Quad Small Form-factor Pluggable) connectors 160 are mounted upon the connecting surface 146, surrounding the opening 142 wherein the upper two are disposed in a horizontal type while the lower two are arranged in an angled and upwardly diverged manner. A ROSA (Receiver Optical Subassembly) 170 includes a fiber assembly 172 with an optical connector 174 at one end, and four OE module subassemblies 176 at two opposite ends wherein the four OE module subassemblies 176 are mated with the corresponding QSFP connectors 160, respectively. "OE" or alternatively "O/E" is used in the present disclosure as an acronym for "optical-to-electronic" or "optic-electronic;" while "EO" or alternatively "E/O" is used herein as an acronym for "electronic-to-optical" or "electronic-optic". The signals transmitted from the ROSA 170 and received by the QSFP connectors 160 on the connecting surface 146 can be converted and wirelessly transmitted to the panel-side kit 300, from the transmitting modules 148, 152 on the coupling surface 144 via electromagnetic signals with extremely high frequency and high speed. The optical connector 174 is connected in an MPO (Multi-fiber Push On) adaptor for connection with a TOSA (Transmitter Optical Subassembly) derived from a smart/control box that will be illustrated later. Notably, the aforementioned arrangement for the four QSFP connectors, i.e., one pair disposed in a horizontal manner while the other pair disposed in an converged angled manner, is to maximize the space use on the printed circuit board.

Each OE module subassembly 176 includes a seat 178 with an inner printed circuit board 180 on which a pair of OE modules 182 with the associated fibers 171 of the fiber assembly 172 are mounted wherein front mating edges 181 of the inner printed circuit board 180 is mated with the QSFP connector 160. Notably, each OE modules subassembly 176 has eight channels so there are thirty-two channels for transmission. Therefore, the transmission modules 148 have a total of thirty-two IC packages 150 corresponding to the thirty-two channels. An electrical connector 143 is located upon the connecting surface 146 corresponding to the transmitting modules 152 on the coupling surface 144.

A (first) secondary printed circuit board assembly 200, also called the power board module or the pogo pin module in the present disclosure, includes a (first) secondary printed circuit board 202 having opposite coupling surface 204 and connecting surface 206, wherein the coupling surface 204 of the secondary printed circuit board 202 is assembled upon the connecting surface 146 of the primary printed circuit board 140 via the screws 131. Notably, the (first) secondary printed circuit board assembly 200 may be attached to the back plate 132 directly and firstly, and then the (first) main printed circuit board 140 is attached to the (first) back plate 132 to cover a peripheral region of the (first) secondary printed circuit board 202. An electrical connector or pogo socket 210 is mounted upon the secondary printed circuit board 200 and extends through the opening 142 and beyond the first surface 144.

The electrical connector 210 includes an insulative housing 220 with a plurality of contacts 222 disposed in the housing 220. Such contacts 222 are the so-called pogo pins, which have axial resiliency. The front end of the contact 222 extends beyond a front face 221 of the housing 220, and a bottom end of the contact 222 extends through a corresponding through hole 208 of the secondary printed circuit board 202. Six WTB (wire-to-board) electrical connectors 230 are mounted upon connecting surface 206. A plurality of cables 240 are electrically and mechanically connected to those connectors 230 so as to be further connected to the contacts 222 of the electrical connector 210 through the secondary printed circuit board 202.

The contacts 222 are a total of twenty four contacts including six signal contacts S, four power contacts P12V, three power contacts P52V, four grounding contacts G12V, three grounding contacts G52V, and four detect contacts D. All contacts 222 are arranged with four concentric ring areas from the center, and the ring areas respectively include four contacts, six contacts, eight contacts and four contacts. Characters of the respective contacts 222 are shown in FIG. 11(A) wherein the power contacts are essentially located in the first and the second ring areas while the grounding contacts are only located in the third ring area from the center. This arrangement is for avoiding any shorting between the power contacts and the grounding contacts because the counterpart connector on the panel-side kit 300 has the similar arrangement and the wall-mount kit 100 and the panel-side kit 300 are coupled with each other with a possible rotation way regard to a center. Understandably, contacts in the different ring areas have no chance to be shorting. Notably, the four contacts 222 in the outermost ring area are the detect contacts D. The height of detect contacts D beyond the coupling surface 204 should not be larger than the heights of other contacts. It is also noted that the distance between the neighboring two contacts in the same ring area should be larger than the diameter of contacts 222 so as to assure no shorting occurring between the contacts 222 and the counterpart contacts of the panel-side kit 300 during rotation. In an embodiment, additional locking contacts (not shown) on an outermost/peripheral region of the secondary printed circuit board may be provided so that the reliable/precise interconnection between the wall-mount kit 100 and the panel-side kit 300 may be confirmed.

Referring to FIGS. 18-32, a display 700, e.g., a television, includes a display panel 702 and back case 704 commonly sandwiching a boundary sealing 706 therebetween. The panel-side kit 300 and the associated parts is mounted upon the inner surface of the back case 704, and is exposed to an exterior through the opening 708 of the back case 704 for coupling with the wall-mount kit 100. It should be noted that in the corresponding drawings FIGS. 18-32, the insulative cover and the bracket are not shown in the panel-side kit 300. Both of those elements may be also used in the panel-side kit 300, as shown in the wall-mount kit 100.

In addition to the bracket and the insulative cover (both not shown), the panel-side kit 300 further includes a (second) core set subassembly 302 having a (second) core set 310 attached to a back plate 304. Similar to the (first) core set 130 of the wall-mount kit 100, the (second) core set 310 includes a (second) main printed circuit board assembly 320 and a (second) secondary printed circuit board assembly 360 attached together. Similar to the (first) main printed circuit board assembly 140 of the wall-mount kit 100, the (second) main printed circuit board assembly 320 of the panel-side kit 300 includes a (second) main printed circuit board 322 attached to the (second) back plate 304, forming an opening 323 for receiving the (second) secondary printed circuit board assembly 360 therein, and forming opposite coupling surface 324 and connecting surface 326 thereon. A pair of wireless receiver/receiving modules 330 are located upon the coupling surface 324 and by two sides of the opening 323. Each of the wireless receiver modules 330, corresponding the transmitting module 148 of the wall-mount kit 100, includes a plurality of IC packages 332 for ultra high frequency receiving as disclosed in the aforementioned U.S. Pat. No. 8,909,135. Notably, a pair of receiver modules 334 are located under the opening 323 for receiving the low speed signals. Reference can be had to U.S. Pat. No. 8,909,135 for information on wireless receiving performed by the receiver modules 334.

Correspondingly, four LVDS (Low Voltage Differential Signaling) electrical connectors 340 electrically connected to the receiver modules 330 for receiving signals from the received module 330, are located upon the connecting surface 326 wherein the upper two are arranged in an angled and upwardly converged manner while the lower two are arranged in a horizontal manner. Understandably, such an arrangement is made for maximizing use of the space on the connecting surface 326 of the main printed circuit board 322. A plurality of cables 500 are connected to the corresponding connectors 340 and further connected to a T-con board (not shown) for displaying the corresponding images. In other words, the signals transmitted from the transmitting module 148 on the wall-mount kit 100 and received by the receiver module 330 on the panel-side kit 30, may be further transferred to a T-con board via the LVDS connector 340 and the corresponding cables 500. A pair of electrical FFC connectors 342 are disposed upon the connecting surface 326 around the upper edge and the lower edge for transmitting signals to the T-con board via the flat flexible cables 510.

The secondary printed circuit board assembly 360 is attached to the primary printed circuit board assembly 320, which is attached to the back plate 304. The secondary printed circuit board assembly 360 includes a secondary printed circuit board 362 forming opposite coupling surface 364 and connecting surface 366, and an electrical connector or center pin socket 370 mounted upon the coupling surface 364 of the secondary printed circuit board 362. The electrical connector 370 includes an insulative housing 372 and a plurality of contacts 374 dispose therein. Understandably, the electrical connector 370 on the panel-side kit 300 is mated with the electrical connector 210 on the wall-mount kit 100. Therefore, the contacts 374 are arranged with characters, e.g., grounding, signal, power and detect, and with positions that are similar to the characters and positions of the contacts 222 of the electrical connector 210 so as to mate with each other. Another FFC connector 344 is disposed upon the connecting surface 366. Four WTB (wire-to-board) connectors 346 are located at an upper region of the coupling surface 362 of the secondary printed circuit board 362 for power delivery upwardly. In other words, different from the wall-mount kit 100 in which the power cable 240 and the fibers assembly 172 both extend upward from a bottom side of the wall-mount kit 100, the panel-side kit 300 has the signal cables 500 linked to the corresponding LVDS connector 340 for signal transmission around the bottom side and the FFC (Flat Flexible Cable) cables 510 linked to the corresponding WTB connectors 346 for power delivery around the top side.

Figure 33:
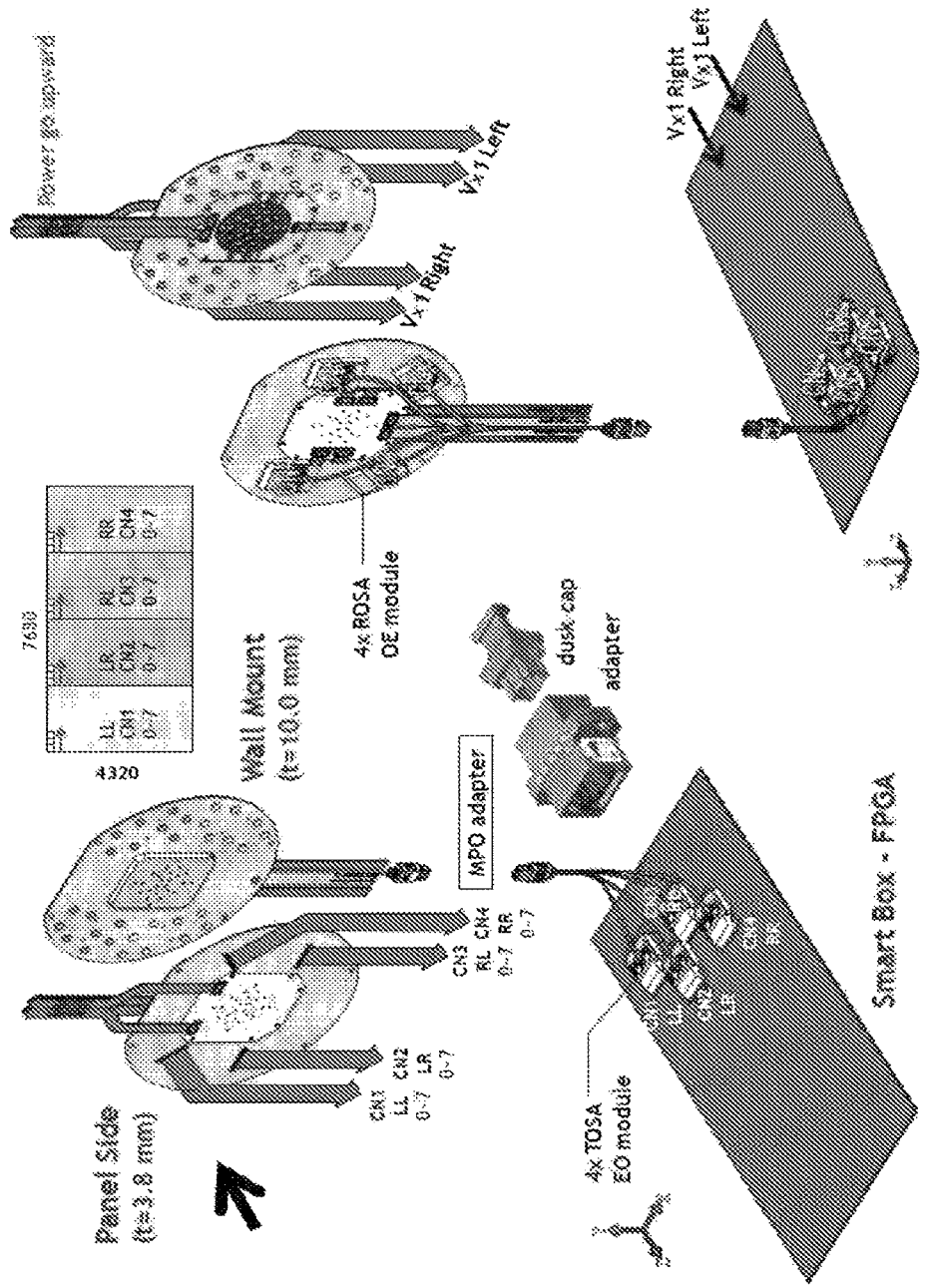
FIG. 33 is a diagram showing the basic structures of the interconnection system including the parts on the smart box and the TOSA other than the wall-mount kit and the panel-side kit disclosed in FIGS. 1-32.
Figure 34:
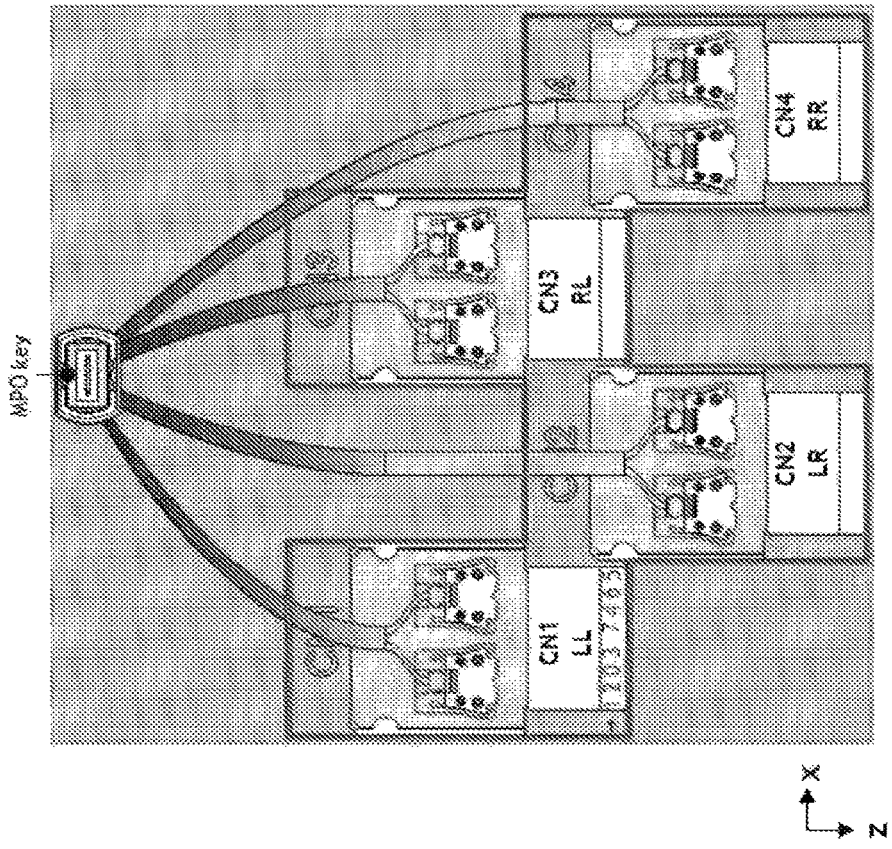
FIG. 34 shows the E/O modules and the corresponding QSFP connectors on the printed circuit board in the smart/control box, that will be connected to the wall-mount kit of FIGS. 1-17.
Figure 35:
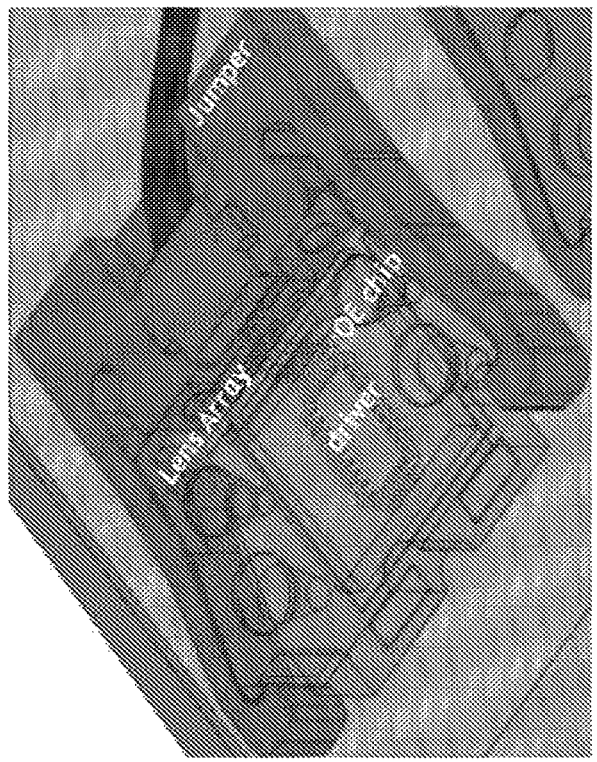
FIG. 35 shows the EO or OE module used with the interconnection system of the invention.

FIGS. 33-35 show the 3D drawings reflecting the invention disclosed in FIGS. 1-32 with more information related to the smart box and the TOSA and the MPO adaptor associated therewith. One important feature of the TOSA is to provide switching fibers with regard to the OE modules, while there are no switching fibers with regard to the OE modules of the ROSA. In brief, the present disclosure provides an interconnection system with a disk-like wall-mount kit and a corresponding disk-like panel-side kit assembled to each other via magnetic forces. The disk-like wall-mount kit and corresponding disk-like panel-side kit include a center region to transmit power, and side regions or a ring type peripheral region to transmit an extremely high frequency signal via electromagnetic signal transmission.

While a preferred embodiment according to the present disclosure has been shown and described, equivalent modifications and changes known to persons skilled in the art according to the spirit of the present disclosure are considered within the scope of the present disclosure as described in the appended claims. Understandably, one feature of the invention is to use a wall mount kit for use with a panel side kit comprising a main printed circuit board assembly with a circular form including IC packages to transmit extremely high frequency signals wherein the circular form would be defined to cover appropriate geometric variations, such as a circle, a substantially circular shape, an annulus, or a substantially annular shape. The circular form of the main printed circuit board assembly provides various advantages, such as arranging IC packages to avoid cross-talk while providing a compact overall configuration, and other advantages as shown below. The additional feature includes a second printed circuit board to deliver at least power located at a central region of main circuit board assembly. Generally speaking, the main printed circuit board assembly has a substantially annular shape, and further comprises a second printed circuit board to deliver at least power located at a central region within the substantially annular shape. In addition, a plurality of groups IC packages to transmit extremely high frequency signals, arranged at different sectors of the circular form wherein for example, four groups of IC packages are arranged at quadrants of the circular form. Correspondingly, ROSAs and associated electrical connectors, are respectively associated with the groups of IC packages wherein for example, four electrical connectors—two oblique, two horizontal. Alternately, the main printed circuit board assembly is configured as a circular disk. From an overview, the main printed circuit board assembly of the wall mount kit and the other main printed circuit board of the panel side kit are both configured as circular disks wherein the circular disk of the wall mount kit is rotatably mountable to the circular disk of the panel side kit to align adjacent pairs of EHF (Extremely High Frequency) transceivers of the disks.

What is claimed is:

1. A wall-mount kit for use with a panel-side kit in an interconnection system comprising:
   a core set including:
   a main printed circuit board assembly including IC (Integrated Circuit) packages to transmit extremely high frequency signals; and
   a secondary printed circuit board assembly including an electrical connector to deliver at least power; wherein
   the secondary printed circuit board assembly is essentially located in a center region of the main printed circuit board assembly; wherein
   said main printed circuit board assembly includes a main printed circuit board with a center opening, and said secondary printed circuit board assembly includes a secondary printed circuit board with said electrical connector thereon, and said electrical connector extends through the center opening.

2. The wall-mount kit as claimed in claim 1, wherein the main printed circuit board assembly and the secondary printed circuit board assembly are discrete from each other while assemble together.

3. The wall-mount-kit as claimed in claim 1, wherein said IC packages transmit electromagnetic signals.

4. The wall-mount kit as claimed in claim 1, wherein said secondary printed circuit board includes a coupling surface on which the electrical connector is mounted, and a connecting surface opposite to said coupling surface, and a plurality of WTB (wire-to-board) connectors are mounted upon the connecting surface around a peripheral region.

5. The wall-mount kit as claimed in claim 1, wherein said main printed circuit board forms oppositely a coupling surface and a connecting surface, and said IC packages are located on the coupling surface and located at two side of said.

6. The wall-mount kit as claimed in claim 5, wherein a plurality of ROSAs (Receiver Optical Subassembly) and associated electrical connectors are mounted upon the connecting surface.

7. The wall-mount kit as claimed in claim 6, wherein an amount of said associated electrical connectors is four, and two of said four electrical connectors are arranged in an oblique manner while the other two are arranged in a horizontal manner.

8. The wall-mount kit as claimed in claim 6, wherein each of said ROSAs includes an OE (Optic-Electronic) module for transforming optical signals to electronic signals, and the associated electrical connectors receive said electronic signals and activate the corresponding IC packages.

9. The wall-mount kit as claimed in claim 1, wherein said main printed circuit board is configured to be like a disk.

10. The wall-mount kit as claimed in claim 1, wherein the electrical connector includes a plurality of contacts arranged in different concentric ring regions of an insulative housing thereof, and said contacts include power contacts and grounding contacts at different ring regions, respectively.

11. The wall-mount kit as claimed in claim 1, further including a back plate and a cover sandwiching the core set therebetween to form a core set subassembly.

12. The wall-mount kit as claimed in claim 11, further a bracket with a center opening surrounded by a rim, wherein the core set subassembly is secured to the rim and located in the center opening.

13. The panel-side kit which said wall-mount kit as claimed in claim 1 is for use with, including: another core set having another main printed circuit board assembly and another secondary printed circuit board assembly located at a center region of said another main printed circuit board assembly; wherein
   said another main printed circuit board assembly includes a plurality of IC packages to receive the extremely high frequency signals from the wall-mount kit, and said another secondary printed circuit board assembly includes another electrical connector to deliver said power.

14. The panel-side kit as claimed in claim 13, wherein said another main printed circuit board assembly and said another secondary printed circuit board assembly are discrete from each other while assembled together.

15. The panel-side kit as claimed in claim 13, wherein said another main printed circuit board assembly includes another main printed circuit board with a center opening in which said another secondary printed circuit board assembly is located, and a plurality of electrical connectors are located upon the said another secondary printed circuit board opposite to said IC packages and connected to corresponding cables.

16. The panel-side kit as claimed in claim 13, wherein said another electrical connector has a plurality of contacts arranged in different ring regions corresponding to the contacts of the electrical connector of the secondary printed circuit board assembly of the wall-mount kit.

17. An interconnection system comprising:
   a wall-mount kit including:
   a core set having a main printed circuit board assembly including IC (Integrated Circuit) packages to transmit extremely high frequency signals; and
   a secondary printed circuit board assembly including an electrical connector to deliver at least power; wherein
   said main printed circuit board assembly further includes a ROSA (Receiver Optical Subassembly) linked to a TOSA (Transmitter Optical Subassembly) extending from a smart box, from which said extremely high frequency signals are derived;
   further comprising a panel-side kit including another core set having another main printed circuit board assembly and another secondary printed circuit board assembly located at a center region of said another main printed circuit board assembly; wherein
   said another main printed circuit board assembly includes a plurality of IC packages to receive the extremely high frequency signals from the wall-mount kit, and said another secondary printed circuit board assembly includes another electrical connector to deliver said power.

18. A wall-mount kit for use with a panel-side kit in an interconnection system comprising:
   a core set including:
   a main printed circuit board assembly including IC (Integrated Circuit) packages to transmit extremely high frequency signals; and
   a secondary printed circuit board assembly including an electrical connector to deliver at least power; wherein the secondary printed circuit board assembly is essentially located in a center region of the main printed circuit board assembly;

further including a back plate and a cover commonly sandwiching the core set therebetween to form a core set subassembly.

19. A wall-mount kit for use with a panel-side kit in an interconnection system comprising:

a core set including:

a main printed circuit board assembly including IC (Integrated Circuit) packages to transmit extremely high frequency signals; and a secondary printed circuit board assembly including an electrical connector to deliver at least power; wherein the second printed circuit board assembly is essentially located in a center region of the main printed circuit board assembly; wherein said IC packages are largely dispersed on the main printed circuit board except said center region; wherein said main printed circuit board assembly and said secondary printed circuit board assembly are mechanically discrete from and electrically disconnected from each other in said core set.

* * * * *